(12) United States Patent
Suzuki et al.

(10) Patent No.: US 12,514,123 B2
(45) Date of Patent: Dec. 30, 2025

(54) ACTUATOR DEVICE AND ACTUATOR SYSTEM

(71) Applicant: HAMAMATSU PHOTONICS K.K., Hamamatsu (JP)

(72) Inventors: Daiki Suzuki, Hamamatsu (JP); Takuma Osaki, Hamamatsu (JP); Makoto Nozaki, Hamamatsu (JP); Kota Sugizaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 911 days.

(21) Appl. No.: 17/736,178

(22) Filed: May 4, 2022

(65) Prior Publication Data

US 2022/0367786 A1 Nov. 17, 2022

(30) Foreign Application Priority Data

May 12, 2021 (JP) .................. 2021-080857
May 12, 2021 (JP) .................. 2021-080861
Sep. 1, 2021 (JP) .................. 2021-142425

(51) Int. Cl.
*H01L 41/09* (2006.01)
*H10N 30/20* (2023.01)
(Continued)

(52) U.S. Cl.
CPC .............. *H10N 30/20* (2023.02); *H10N 30/87* (2023.02); *H10N 30/88* (2023.02)

(58) Field of Classification Search
CPC ......... H10N 30/20; H10N 30/87; H10N 30/88
See application file for complete search history.

(56) References Cited

U.S. PATENT DOCUMENTS 11,567,100 B2  1/2023  Reinke
11,581,480 B2  2/2023  Akahane
(Continued)

FOREIGN PATENT DOCUMENTS

CN  115340059 A  11/2022
CN  115417369 A  12/2022
(Continued)

OTHER PUBLICATIONS

Office Action issued May 28, 2025 in related U.S. Appl. No. 17/736,146.
(Continued)

*Primary Examiner* — Sean Gugger
(74) *Attorney, Agent, or Firm* — Faegre Drinker Biddle & Reath LLP

(57) ABSTRACT

An actuator device includes a wiring substrate; a metal substrate; a first electrode unit provided to the metal substrate; a piezoelectric drive body disposed on the first electrode unit; a second electrode unit disposed on a first main surface of the piezoelectric drive body; a piezoelectric detection body disposed on the second electrode unit; a third electrode unit disposed on a third main surface of the piezoelectric detection body; a connection unit; an input unit; and an output unit. The connection unit is configured to be electrically connected to a reference potential on an outside such that a potential of the second electrode unit becomes the reference potential. The input unit is configured to input a drive signal to the first electrode unit from the outside. The output unit is configured to output an output signal generated in the piezoelectric detection body, to the outside from the third electrode unit.

14 Claims, 7 Drawing Sheets

(51) Int. Cl.
*H10N 30/87* (2023.01)
*H10N 30/88* (2023.01)

(56) References Cited

U.S. PATENT DOCUMENTS

| | | | |
|---|---|---|---|
| 2010/0110527 A1 | 5/2010 | Liu et al. | |
| 2010/0327703 A1 | 12/2010 | Uetani et al. | |
| 2013/0301099 A1 | 11/2013 | Mizoguchi et al. | |
| 2016/0049574 A1* | 2/2016 | Iwazaki | H10N 30/802 310/317 |
| 2017/0199375 A1 | 7/2017 | Naono | |
| 2017/0217764 A1 | 8/2017 | Li et al. | |
| 2018/0040514 A1 | 2/2018 | Goh et al. | |
| 2018/0062065 A1* | 3/2018 | Arakawa | H10N 30/88 |
| 2018/0088336 A1 | 3/2018 | Hino et al. | |
| 2018/0151796 A1 | 5/2018 | Akahane | |
| 2018/0226563 A1 | 8/2018 | Kijima et al. | |
| 2020/0073113 A1 | 3/2020 | Nystrom | |
| 2020/0363631 A1 | 11/2020 | Luizzi et al. | |
| 2021/0140993 A1 | 5/2021 | Reinke | |
| 2021/0343925 A1* | 11/2021 | Saito | H10N 30/302 |
| 2022/0365337 A1 | 11/2022 | Suzuki et al. | |
| 2022/0367783 A1 | 11/2022 | Suzuki et al. | |
| 2022/0367786 A1 | 11/2022 | Suzuki et al. | |

FOREIGN PATENT DOCUMENTS

| | | |
|---|---|---|
| JP | H7-128361 A | 5/1995 |
| JP | H10-315485 A | 12/1998 |
| JP | 2010-103987 A | 5/2010 |
| JP | 2011-150038 A | 8/2011 |
| JP | 2011-179015 A | 9/2011 |
| JP | 2012-058367 A | 3/2012 |
| JP | 2012-078389 A | 4/2012 |
| JP | 2012-247523 A | 12/2012 |
| JP | 2013-114014 A | 6/2013 |
| JP | 2013-164278 A | 8/2013 |
| JP | 2014-160140 A | 9/2014 |
| JP | 2015-018047 A | 1/2015 |
| JP | 2016-081986 A | 5/2016 |
| JP | 2017-156522 A | 9/2017 |
| JP | 2019-045770 A | 3/2019 |
| JP | 2019-125777 A | 7/2019 |
| JP | 2019-132906 A | 8/2019 |
| JP | 2020-027893 A | 2/2020 |
| JP | 2020-187292 A | 11/2020 |
| JP | 2021-087135 A | 6/2021 |
| JP | 2022-176027 A | 11/2022 |
| JP | 2022-176066 A | 11/2022 |
| JP | 7367494 B2 | 10/2023 |
| JP | 7672925 B2 | 5/2025 |
| WO | 2015/064423 A1 | 5/2015 |
| WO | 2015/198513 A1 | 12/2015 |

OTHER PUBLICATIONS

Office Action issued May 28, 2025 in related U.S. Appl. No. 17/736,161.
Machine translation of Tanaka et al. JP 2020187292, Nov. 19, 2020.
Notice of Allowance mailed Jun. 3, 2025 in U.S. Appl. No. 17/736,136.

* cited by examiner

ACTUATOR DEVICE AND ACTUATOR SYSTEM

TECHNICAL FIELD

The present disclosure relates to an actuator device and an actuator system.

BACKGROUND

An actuator device has been known which includes a metal substrate including a movable portion that is oscillatable; a support body that supports the metal substrate; a piezoelectric drive body disposed on one main surface of the metal substrate; and a piezoelectric detection body disposed on the other main surface of the metal substrate (for example, refer to Japanese Unexamined Patent Publication No. 2014-160140). In such an actuator device, the piezoelectric drive body functions as a piezoelectric body that operates the movable portion, and the piezoelectric detection body functions as a piezoelectric body configured to detect an operation amount of the movable portion.

In the above-described actuator device, since the piezoelectric drive body is disposed on the one main surface of the metal substrate, and the piezoelectric detection body is disposed on the other main surface of the metal substrate, a variation in a relative positional relationship between the piezoelectric drive body and the piezoelectric detection body is likely to occur. When a variation in the positional relationship occurs, it is difficult to accurately detect an operation amount of the movable portion. Specifically, when a drive signal to cause a resonant operation of the movable portion is input to the piezoelectric drive body, an output signal output from the piezoelectric detection body includes a static strain signal from the piezoelectric drive body. For this reason, in order to obtain a resonant signal of the movable portion, an estimated static strain signal estimated to be included in the output signal needs to be subtracted from the output signal. At this time, when a variation in the relative positional relationship between the piezoelectric drive body and the piezoelectric detection body occurs, a variation in a phase difference between the output signal and the estimated static strain signal occurs, and as a result, the accuracy of the resonant signal of the movable portion decreases, and it is difficult to accurately detect an operation amount of the movable portion.

SUMMARY

An object of the present disclosure is to provide an actuator device and an actuator system capable of accurately detecting an operation amount of a movable portion.

An actuator device according to one aspect of the present disclosure includes: a support body; a metal substrate supported by the support body; a first electrode unit provided to the metal substrate; a first piezoelectric body disposed on the first electrode unit, and having a first main surface opposite the first electrode unit, and a second main surface on a first electrode unit side; a second electrode unit disposed on the first main surface; a second piezoelectric body disposed on the second electrode unit, and having a third main surface opposite the second electrode unit, and a fourth main surface on a second electrode unit side; a third electrode unit disposed on the third main surface; a connection unit electrically connected to the second electrode unit; an input unit electrically connected to one electrode unit of the first electrode unit and the third electrode unit; and an output unit electrically connected to the other electrode unit of the first electrode unit and the third electrode unit. The metal substrate includes a movable portion, a main body portion provided with the first electrode unit, and a coupling portion coupling the movable portion and the main body portion. A piezoelectric body on one electrode unit side of the first piezoelectric body and the second piezoelectric body is a piezoelectric drive body configured to drive the movable portion. A piezoelectric body on the other electrode unit side of the first piezoelectric body and the second piezoelectric body is a piezoelectric detection body configured to detect an operation amount of the movable portion. The connection unit is configured to be electrically connected to a reference potential on an outside such that a potential of the second electrode unit becomes the reference potential. The input unit is configured to input a drive signal to the one electrode unit from the outside, the drive signal being a signal to drive the piezoelectric drive body. The output unit is configured to output an output signal to the outside from the other electrode unit, the output signal generated in the piezoelectric detection body.

DETAILED DESCRIPTION

Figure 1:
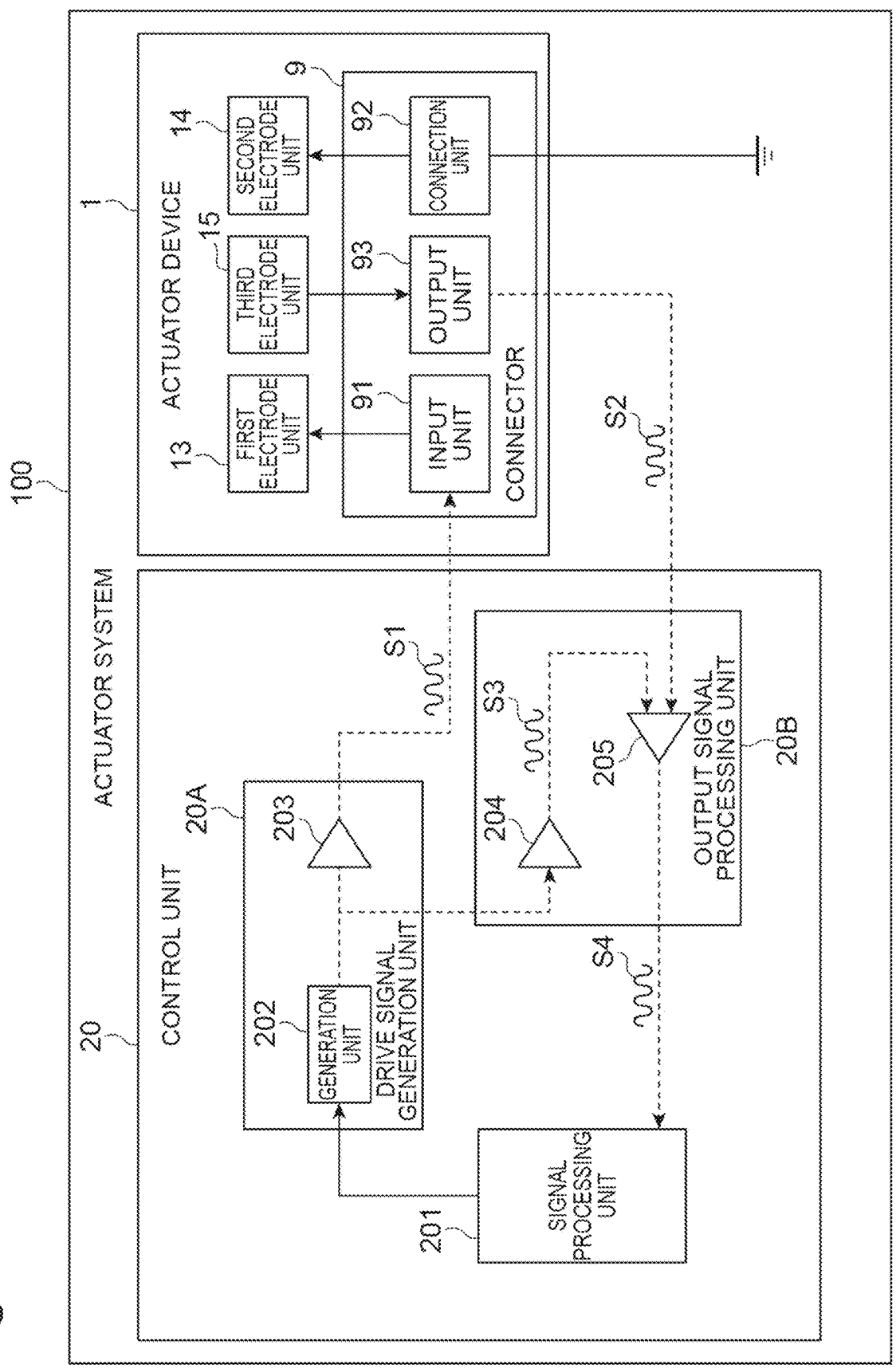
FIG. 1 is a block diagram of an actuator system of one embodiment.

Hereinafter, an embodiment of the present disclosure will be described in detail with reference to the drawings. Incidentally, in the drawings, the same or equivalent portions are denoted by the same reference signs, and duplicated descriptions will be omitted.

[Configuration of Actuator System]

As illustrated in FIG. 1, an actuator system 100 includes an actuator device 1 and a control unit 20. The actuator device 1 is electrically connected to the control unit 20. In the actuator system 100, a drive signal S1 to drive the actuator device 1 is input to the actuator device 1 from the control unit 20, and an output signal S2 generated in the actuator device 1 is output to the control unit 20 (details will be described later).

[Configuration of Actuator Device]

As illustrated in FIGS. 2 to 5, the actuator device 1 includes a wiring substrate (support body) 2; a metal substrate 3; a conductive portion 30; a bonding member (first bonding member) 4; an optical function unit 5 having an optical surface 51; a piezoelectric drive element 6; a piezoelectric detection element 7; a bonding member (second bonding member) 8A; a bonding member (third bonding member) 8B; a connector 9; a wire (first wire) 11; and a wire (second wire) 12. The optical function unit 5 is provided to the metal substrate 3. The actuator device 1 is housed, for example, in a package (not illustrated). As one example, the package includes side walls, a bottom wall, and a top wall made of a material that transmits light, and has a box shape. For example, in the actuator device 1, when laser light is incident into the package via the top wall, the laser light is reflected by the optical surface 51 of the optical function unit 5 that is caused to periodically oscillate via the metal substrate 3 by the piezoelectric drive element 6, and is output to the outside via the top wall. An output direction of the laser light from the package changes periodically and continuously according to oscillation of the optical surface 51. Namely, in the present embodiment, the actuator device 1 is an optical scanning device.

The wiring substrate 2 has a placement surface 2a on which the metal substrate 3 is placed. An opening 2b that is open on the placement surface 2a and on a surface opposite the placement surface 2a is formed in the wiring substrate 2. The wiring substrate 2 has, for example, a rectangular frame shape. Examples of the material of the wiring substrate 2 include silicon, ceramic, quartz, glass, and plastic. As the wiring substrate 2, it is possible to use, for example, a glass composite substrate (CEM-3) in which a base material obtained by mixing a glass fabric and a non-woven glass fabric is impregnated with an epoxy resin, a glass epoxy substrate (FR-4) in which layers of glass fiber fabrics are impregnated with an epoxy resin, a heat dissipation metal substrate in which copper, aluminum or the like is used as a base material, or the like. The thickness of the wiring substrate 2 may be set to a thickness with which sufficient rigidity can be secured, and is, for example, 0.8 mm or more. In the present embodiment, the thickness of the wiring substrate 2 is 1.6 mm. In the following description, a thickness direction of the wiring substrate 2 is referred to as a Z-axis direction (thickness direction of the metal substrate), one direction perpendicular to the Z-axis direction is referred to as an X-axis direction, and a direction perpendicular to both the Z-axis direction and the X-axis direction is referred to as a Y-axis direction.

The wiring substrate 2 includes a plurality (in the present embodiment, three) of electrode pads that are an electrode pad (second electrode pad) 21, an electrode pad (third electrode pad) 22, and an electrode pad (first electrode pad) 23. The electrode pads 21, 22, and 23 are disposed (provided) on the placement surface 2a. The plurality of electrode pads 21, 22, and 23 are located on one side in the Y-axis direction with respect to the opening 2b of the wiring substrate 2, and are arranged along the X-axis direction.

The connector 9 is attached to the placement surface 2a of the wiring substrate 2 (the connector 9 is disposed on the placement surface 2a of the wiring substrate 2). The connector 9 is a port through which a voltage signal or the like is input to or output from each of the piezoelectric drive element 6 and the piezoelectric detection element 7. The connector 9 is, for example, a general-purpose connector into which a flexible printed substrate (not illustrated) electrically connected to the control unit 20 is inserted. The connector 9 is electrically connected to the control unit 20 via the flexible printed substrate and the like. The type of the connector 9 is not limited. The connector 9 is located, for example, on one side in the Y-axis direction with respect to the plurality of electrode pads 21, 22, and 23. The connector 9 includes a plurality of terminals 90. The connector 9 is electrically connected to the plurality of electrode pads 21, 22, and 23 via the plurality of terminals 90, wirings of the wiring substrate 2 and the like.

The metal substrate 3 is supported by the wiring substrate 2. The metal substrate 3 is made of, for example, iron-based, stainless-based, copper-based, permalloy-based, titanium-based, tungsten-based, molybdenum-based metal, or the like, and has a plate shape. The thickness of the metal substrate 3 is, for example, 50 to 500 μm. The bonding member 4 bonds the wiring substrate 2 and the metal substrate 3. The bonding member 4 has conductivity. Examples of the material of the bonding member 4 include an epoxy resin containing Ag particles.

The metal substrate 3 includes a main body portion 31; a movable portion 32; a first extending portion 33; a second extending portion 34; a first coupling portion (coupling portion) 35; a second coupling portion (coupling portion) 36; a first connection portion 37; a second connection portion 38; and a third connection portion 39. The movable portion 32, the first extending portion 33, the second extending portion 34, the first coupling portion 35, the second coupling portion 36, the first connection portion 37, the second connection portion 38, and the third connection portion 39 are integrally formed.

The main body portion 31 is located inside the opening 2b of the wiring substrate 2 when viewed in the Z-axis direction. The movable portion 32 is a portion on which the optical function unit 5 is disposed. The movable portion 32 is located on the other side in the Y-axis direction with respect to the main body portion 31.

The first extending portion 33 and the second extending portion 34 extend from the main body portion 31 such that the movable portion 32 is located between the first extending portion 33 and the second extending portion 34. In the present embodiment, the movable portion 32 is located in the middle between the first extending portion 33 and the second extending portion 34. For example, the first extending portion 33 and the second extending portion 34 extend parallel to each other along the Y-axis direction. In the present embodiment, the first extending portion 33 has the same shape as that of the second extending portion 34.

The first coupling portion 35 extends along the X-axis direction between the first extending portion 33 and the movable portion 32. One end portion of the first coupling portion 35 is connected to the first extending portion 33, and the other end portion of the first coupling portion 35 is connected to the movable portion 32. Namely, the first coupling portion 35 couples the movable portion 32 and the main body portion 31 via the first extending portion 33 by coupling the first extending portion 33 and the movable portion 32.

The second coupling portion 36 extends along the X-axis direction between the second extending portion 34 and the movable portion 32. One end portion of the second coupling portion 36 is connected to the second extending portion 34, and the other end portion of the second coupling portion 36 is connected to the movable portion 32. Namely, the second coupling portion 36 couples the movable portion 32 and the main body portion 31 via the second extending portion 34 by coupling the second extending portion 34 and the movable portion 32.

In the present embodiment, the first coupling portion 35 and the second coupling portion 36 are located on a single straight line along the X-axis direction. From a positional relationship between the first extending portion 33 and the movable portion 32, and a positional relationship between the second extending portion 34 and the movable portion 32 described above, a length of the first coupling portion 35 in the X-axis direction is the same as a length of the second coupling portion 36 in the X-axis direction. In the present embodiment, the first coupling portion 35 has the same shape as that of the second coupling portion 36.

The movable portion 32, the first extending portion 33, the second extending portion 34, the first coupling portion 35, and the second coupling portion 36 are located inside the opening 2b of the wiring substrate 2 when viewed in the Z-axis direction. The first coupling portion 35 and the second coupling portion 36 function as torsion bars that elastically deform such that torsion bars twist according to deformation (displacement) of the first extending portion 33 and the second extending portion 34. The movable portion 32 oscillates around an axis along the X-axis direction according to elastic deformation of the first coupling portion 35 and the second coupling portion 36. Namely, the movable portion 32 is oscillatably supported by the first extending portion 33 and the second extending portion 34 via the first coupling portion 35 and via the second coupling portion 36.

The optical function unit 5 is disposed on a surface on an opposite side of the movable portion 32 from the opening 2b. The optical function unit 5 has, for example, a disk shape. The optical function unit 5 is attached to the movable portion 32 such that the optical surface 51 faces opposite the movable portion 32. The optical surface 51 is disposed in the middle between the first extending portion 33 and the second extending portion 34 in the X-axis direction. In the present embodiment, each of the metal substrate 3 and the optical surface 51 has a shape that is line symmetric with respect to a straight line passing through the center of the optical surface 51 along the Y-axis direction. As one example, the optical function unit 5 is made of glass or a semiconductor material such as silicon, and the optical surface 51 is formed of a reflective film formed on a surface on an opposite side of the optical function unit 5 from the movable portion 32. Namely, the optical surface 51 is a mirror surface (reflective surface). Incidentally, the reflective film of the optical function unit 5 can be omitted. In that case, the surface itself of the optical function unit 5 on the opposite side may be used as the optical surface 51.

The first connection portion 37 is connected to the first extending portion 33. The first connection portion 37 is located on the other side in the Y-axis direction with respect to the first extending portion 33. A portion on the other side of the first connection portion 37 in the Y-axis direction faces a portion of the wiring substrate 2. The bonding member 4 is disposed between the portion on the other side of the first connection portion 37 and the portion of the wiring substrate 2. Incidentally, an electrode pad (not illustrated) electrically connected to the electrode pad 23 to have the same potential as that of the electrode pad 23 may be disposed on the portion of the wiring substrate 2.

The second connection portion 38 is connected to the second extending portion 34. The second connection portion 38 is located on the other side in the Y-axis direction with respect to the second extending portion 34. A portion on the other side of the second connection portion 38 in the Y-axis direction faces a portion of the wiring substrate 2. The bonding member 4 is disposed between the portion on the other side of the second connection portion 38 and the portion of the wiring substrate 2. Incidentally, an electrode pad (not illustrated) electrically connected to the electrode pad 23 to have the same potential as that of the electrode pad 23 may be disposed on the portion of the wiring substrate 2. In the present embodiment, the first connection portion 37 and the second connection portion 38 are in a line symmetric relationship with respect to the straight line passing through the center of the optical surface 51 along the Y-axis direction.

The third connection portion 39 is connected to the main body portion 31. The third connection portion 39 is located on one side in the Y-axis direction with respect to the main body portion 31. A portion on one side of the third connection portion 39 in the Y-axis direction faces a portion of the wiring substrate 2 (portion on which the electrode pad 23 is disposed). The bonding member 4 is disposed between the portion on the one side of the third connection portion 39 and the portion of the wiring substrate 2. The bonding member 4 bonds the third connection portion 39 and the electrode pad 23.

Figure 5:
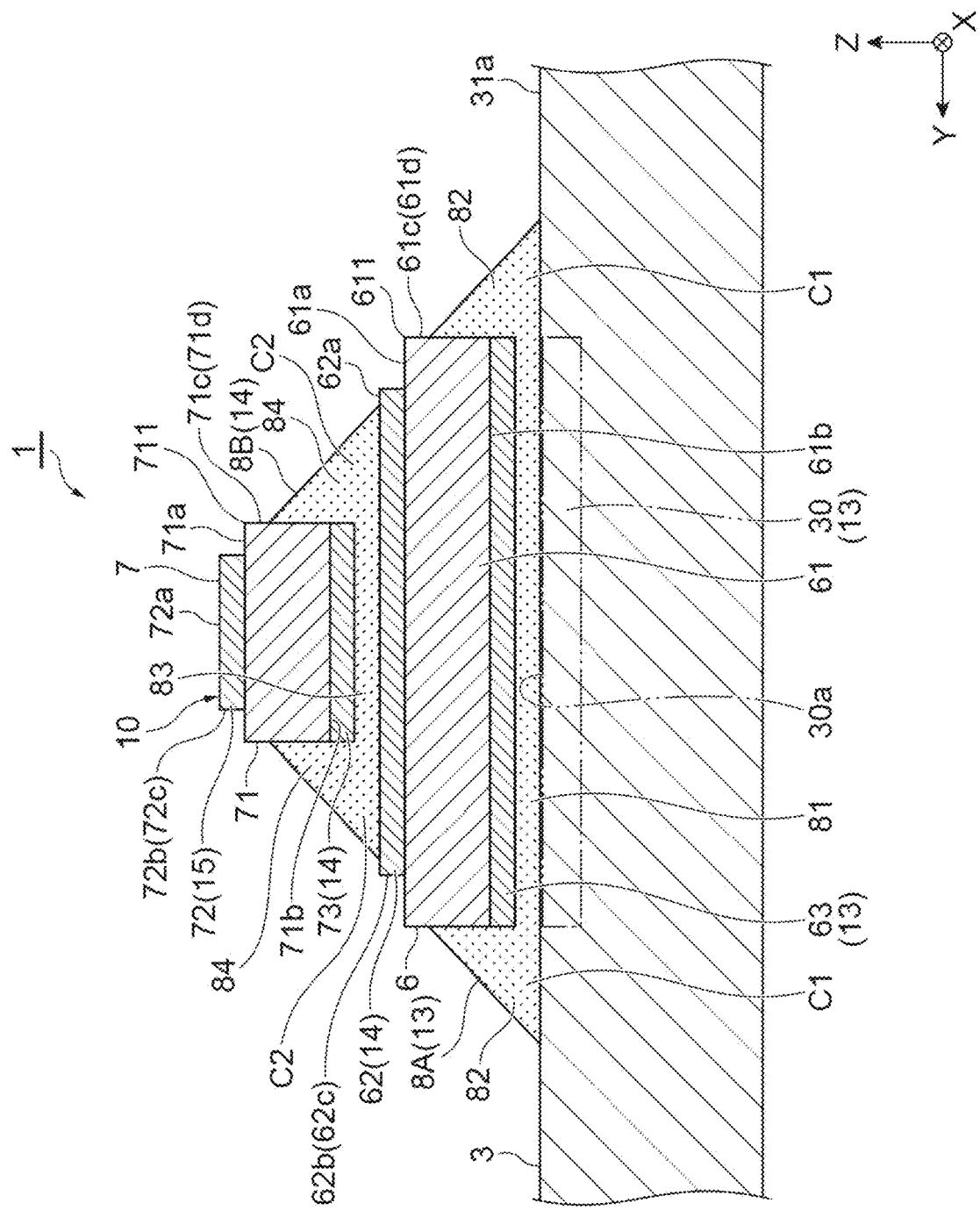
FIG. 5 is a cross-sectional view taken along line V-V illustrated in FIG. 4.

As illustrated in FIG. 5, the conductive portion 30 is integrally formed with the metal substrate 3. The conductive portion 30 is located opposite the opening 2b in a member forming the metal substrate 3 and the conductive portion 30. The conductive portion 30 faces an electrode 63 included in the piezoelectric drive element 6. The conductive portion 30 has a surface 30a opposite the opening 2b. The surface 30a is disposed on the same surface as a main surface 31a on an opposite side of the main body portion 31 from the opening 2b. The conductive portion 30 is made of a conductive material and is electrically connected to the metal substrate 3. The conductive portion 30 functions as a part of a first electrode unit 13 that inputs a voltage signal to a piezoelectric drive body 61 included in the piezoelectric drive element 6. Details of the first electrode unit 13 will be described later. Incidentally, in FIGS. 2 and 3, the illustration of the conductive portion 30 is omitted.

The piezoelectric drive element 6 is an element that generates plate waves in the metal substrate 3 to drive the actuator device 1. The piezoelectric drive element 6 is disposed on the surface 30a of the conductive portion 30. The center of the piezoelectric drive element 6 in the X-axis direction is identical to the center of the movable portion 32 in the X-axis direction (namely, the center of the optical surface 51 in the X-axis direction). The piezoelectric drive element 6 includes the piezoelectric drive body (a first piezoelectric body or a piezoelectric body on one electrode unit side) 61, an electrode (second electrode) 62, and an electrode (first electrode) 63 (refer to FIG. 5).

The piezoelectric drive body 61 is a piezoelectric body that operates the movable portion 32. In the present embodiment, the piezoelectric drive body 61 causes the movable portion 32 to oscillate. The piezoelectric drive body 61 includes a first main surface 61a and a second main surface 61b (refer to FIG. 5). The first main surface 61a is a main surface on an opposite side of the piezoelectric drive body 61 from the surface 30a. The electrode 62 is disposed on the first main surface 61a. The second main surface 61b is a main surface on a surface 30a side of the piezoelectric drive body 61. The electrode 63 is disposed on the second main surface 61b. Each of the electrode 62 and the electrode 63 is, for example, a Ni/Au layer. In the Ni/Au layer, a Ni layer is disposed on the first main surface 61a, and a Au layer is disposed on the Ni layer. A thickness of the Ni layer is larger than a thickness of the Au layer. Each of the piezoelectric drive body 61, the electrode 62, and the electrode 63 has, for example, a rectangular plate shape. The piezoelectric drive body 61 is electrically connected to the electrode 62 by being joined to the electrode 62. The piezoelectric drive body 61 is electrically connected to the electrode 63 by being joined to the electrode 63. The bonding member 8A is disposed between the electrode 63 and the main body portion 31. The bonding member 8A bonds the piezoelectric drive body 61 and the metal substrate 3, and the conductive portion 30. The bonding member 8A has conductivity.

Examples of the material of the bonding member 8A include an epoxy resin containing Ag particles.

The piezoelectric detection element 7 is an element configured to detect an operation amount of the movable portion 32. In the present embodiment, the piezoelectric detection element 7 detects an oscillation angle and a phase of the movable portion 32. Details of the phase of the movable portion 32 will be described later. The piezoelectric detection element 7 is disposed on a surface 62a. The surface 62a is a main surface on an opposite side of the electrode 62 from the piezoelectric drive body 61. The center of the piezoelectric detection element 7 in the X-axis direction is identical to the center of the piezoelectric drive element 6 in the X-axis direction. The piezoelectric detection element 7 includes a piezoelectric detection body (a second piezoelectric body or a piezoelectric body on the other electrode unit side) 71, an electrode (fourth electrode) 72, and an electrode (third electrode) 73 (refer to FIG. 5). The piezoelectric detection body 71 is a piezoelectric body configured to detect an operation amount of the movable portion 32. In the present embodiment, the piezoelectric detection body 71 detects an oscillation angle and a phase of the movable portion 32. The piezoelectric detection body 71 includes a third main surface 71a and a fourth main surface 71b (refer to FIG. 5). The third main surface 71a is a main surface on an opposite side of the piezoelectric detection body 71 from the electrode 62. The electrode 72 is disposed on the third main surface 71a. The fourth main surface 71b is a main surface on an electrode 62 side of the piezoelectric detection body 71. The electrode 73 is disposed on the fourth main surface 71b. Each of the electrode 72 and the electrode 73 is, for example, a Ni/Au layer. Each of the piezoelectric detection body 71, the electrode 72, and the electrode 73 has, for example, a rectangular plate shape. The piezoelectric detection body 71 is electrically connected to the electrode 72 by being joined to the electrode 72. The piezoelectric detection body 71 is electrically connected to the electrode 73 by being joined to the electrode 73. The bonding member 8B is disposed between the electrode 73 and the electrode 62. The bonding member 8B bonds the piezoelectric detection body 71 and the piezoelectric drive body 61. The bonding member 8B has conductivity. Examples of the material of the bonding member 8B include an epoxy resin containing Ag particles.

[Configuration of Piezoelectric Unit]

Here, the actuator device 1 includes a piezoelectric unit 10. The piezoelectric unit 10 includes the metal substrate 3, the piezoelectric drive element 6, the piezoelectric detection element 7, the bonding member 8A, and the bonding member 8B described above. Hereinafter, a configuration of the piezoelectric unit 10 will be described in more detail with reference to FIGS. 4 and 5.

The piezoelectric drive body 61 of the piezoelectric drive element 6 further includes a side surface 61c. The piezoelectric drive element 6 is disposed on the surface 30a of the conductive portion 30 such that a part of the main surface 31a of the main body portion 31 is located outside the side surface 61c of the piezoelectric drive body 61. Accordingly, a corner C1 is formed by the part of the main surface 31a and the side surface 61c of the piezoelectric drive body 61. The part of the main surface 31a is a portion of the main surface 31a outside the side surface 61c. Incidentally, the side surface 61c corresponds to an outer edge 61d of the piezoelectric drive body 61 when viewed in the Z-axis direction.

The bonding member 8A includes a first portion 81 and a second portion 82. The first portion 81 is a portion disposed between the surface 30a of the conductive portion 30 and the piezoelectric drive element 6. The second portion 82 is continuous from the first portion 81 and is disposed in the corner C1. "The second portion 82 is continuous from the first portion 81" means that the first portion 81 and the second portion 82 are integrally formed without an interface therebetween. The second portion 82 is in contact with the side surface 61c of the piezoelectric drive body 61 and with the part of the main surface 31a of the main body portion 31. In the present embodiment, a surface of the second portion 82 is flat. As one example, the second portion 82 is continuous over the entirety of the corner C1 when viewed in the Z-axis direction.

At least a part of the second portion 82 reaches a region on the electrode 62 side of the side surface 61c of the piezoelectric drive body 61. "At least a part of the second portion 82 reaches a region on the electrode 62 side of the side surface 61c of the piezoelectric drive body 61" means that the second portion 82 is in contact with half a region on the electrode 62 side of the side surface 61c in the Z-axis direction. In addition, the second portion 82 does not reach an outer edge 611 of the first main surface 61a. Namely, a highest edge portion of the second portion 82 is not in contact with the outer edge 611. Namely, the bonding member 8A disposed between the main surface 31a of the metal substrate and the surface 30a of the conductive portion 30 does not reach the electrode 62.

As one example, the height of the first portion 81 in the Z-axis direction is 10 to 100 µm. A height of the second portion 82 in the Z-axis direction is larger than the sum of the height of the first portion 81 and a thickness of the electrode 63 in the Z-axis direction, and is equal to or less than the sum of the height of the first portion 81, the thickness of the electrode 63, and a thickness of the piezoelectric drive body 61 in the Z-axis direction. As one example, the height of the second portion 82 is 15 µm to 300 µm. As one example, the width of the second portion 82 in the X-axis direction and in the Y-axis direction is 100 to 500 µm. "The width of the second portion 82 in the X-axis direction and in the Y-axis direction" includes a width by which the second portion 82 protrudes from the side surface 61c of the piezoelectric drive body 61, in a cross section of the piezoelectric drive element 6 and the bonding member 8A taken along the Y-axis direction, and a width by which the second portion 82 protrudes from the side surface 61c of the piezoelectric drive body 61, in a cross section of the piezoelectric drive element 6 and the bonding member 8A taken along the X-axis direction. The piezoelectric drive body 61 has a shape in which a center point can be specified and which is point symmetric with respect to the center point when viewed in the Z-axis direction. As one example, the piezoelectric drive body 61 has a rectangular plate shape. Each of the width of the piezoelectric drive body 61 in the X-axis direction and the width of the piezoelectric drive body 61 in the Y-axis direction is, for example, 2 to 20 mm, and the thickness of the piezoelectric drive body 61 is approximately 200 µm. As one example, the piezoelectric drive body 61 has an oblong plate shape having the X-axis direction as a longitudinal direction. As one example, each of the thickness of the electrode 62 and the thickness of the electrode 63 is 1 to 2 µm. In addition, as one example, the bonding member 8A has a Young's modulus of 1 MPa or more.

A width of the electrode 62 in the X-axis direction is smaller than the width of the piezoelectric drive body 61 in the X-axis direction, and a width of the electrode 62 in the Y-axis direction is smaller than the width of the piezoelectric drive body 61 in the Y-axis direction. In addition, when viewed in the Z-axis direction, an outer edge 62c of the electrode 62 is located inside the outer edge 61*d* of the piezoelectric drive body 61. "When viewed in the Z-axis direction, the outer edge 62*c* of the electrode 62 is located inside the outer edge 61*d* of the piezoelectric drive body 61" means that the outer edge 61*d* of the piezoelectric drive body 61 surrounds the outer edge 62*c* of the electrode 62 when viewed in the Z-axis direction. Namely, when viewed in the Z-axis direction, the outer edge 62*c* is offset from the outer edge 61*d* to a center side of the piezoelectric drive body 61. As one example, a distance between the outer edge 62*c* and the outer edge 61*d* when viewed in the Z-axis direction is larger than the thickness of the piezoelectric drive body 61. The distance between the outer edge 62*c* and the outer edge 61*d* is, for example, approximately 250 μm. In the present embodiment, the distance between the outer edge 62*c* and the outer edge 61*d* when viewed in the Z-axis direction is larger than a distance between the highest edge portion of the second portion 82 and the outer edge 611 of the first main surface 61*a* when seen in the X-axis direction. According to this configuration, it is possible to reliably prevent the bonding member 8A having conductivity from coming into contact with the electrode 62. The distance between the highest edge portion of the second portion 82 and the outer edge 611 when seen in the X-axis direction is, for example, approximately 50 μm.

The piezoelectric detection body 71 of the piezoelectric detection element 7 further includes a side surface 71*c*. The piezoelectric detection element 7 is disposed on the surface 62*a* such that a part of the surface 62*a* of the electrode 62 is located outside the side surface 71*c* of the piezoelectric detection body 71. Accordingly, a corner C2 is formed by the part of the surface 62*a* of the electrode 62 and the side surface 71*c* of the piezoelectric detection body 71. The part of the surface 62*a* is a portion of the surface 62*a* outside the side surface 71*c*. Incidentally, the side surface 71*c* corresponds to an outer edge 71*d* of the piezoelectric detection body 71 when viewed in the Z-axis direction.

The bonding member 8B further includes a third portion 83 and a fourth portion 84. The third portion 83 is a portion disposed between the surface 62*a* of the electrode 62 and the piezoelectric detection element 7. The fourth portion 84 is continuous from the third portion 83 and is disposed in the corner C2. "The fourth portion 84 is continuous from the third portion 83" means that the third portion 83 and the fourth portion 84 are integrally formed without an interface therebetween. The fourth portion 84 is in contact with the side surface 71*c* of the piezoelectric detection body 71 and with the part of the surface 62*a* of the electrode 62. In the present embodiment, a surface of the fourth portion 84 is flat. As one example, the fourth portion 84 is continuous over the entirety of the corner C2 when viewed in the Z-axis direction.

At least a part of the fourth portion 84 reaches a region on an electrode 72 side of the side surface 71*c* of the piezoelectric detection body 71. "At least a part of the fourth portion 84 reaches a region on the electrode 72 side of the side surface 71*c* of the piezoelectric detection body 71" means that the fourth portion 84 is in contact with half a region on the electrode 72 side of the side surface 71*c* in the Z-axis direction. In addition, the fourth portion 84 does not reach an outer edge 711 of the third main surface 71*a*. Namely, a highest edge portion of the fourth portion 84 is not in contact with the outer edge 711. Namely, the bonding member 8B disposed on the surface 62*a* of the electrode 62 does not reach the electrode 72.

As one example, the height of the third portion 83 in the Z-axis direction is 10 to 100 μm. A height of the fourth portion 84 in the Z-axis direction is larger than the sum of the height of the third portion 83 and a thickness of the electrode 73 in the Z-axis direction, and is equal to or less than the sum of the height of the third portion 83, the thickness of the electrode 73, and a thickness of the piezoelectric detection body 71 in the Z-axis direction. As one example, the height of the fourth portion 84 is 15 μm to 300 μm. As one example, the width of the fourth portion 84 in the X-axis direction and in the Y-axis direction is 100 to 500 μm. "The width of the fourth portion 84 in the X-axis direction and in the Y-axis direction" includes a width by which the fourth portion 84 protrudes from the side surface 71*c* of the piezoelectric detection body 71, in a cross section of the piezoelectric detection element 7 and the bonding member 8B taken along the Y-axis direction, and a width by which the fourth portion 84 protrudes from the side surface 71*c* of the piezoelectric detection body 71, in a cross section of the piezoelectric detection element 7 and the bonding member 8B taken along the X-axis direction. The piezoelectric detection body 71 has a shape in which a center point can be specified and which is point symmetric with respect to the center point when viewed in the Z-axis direction. As one example, the piezoelectric detection body 71 has a rectangular plate shape. Each of the width of the piezoelectric detection body 71 in the X-axis direction and the width of the piezoelectric detection body 71 in the Y-axis direction is, for example, 2 to 20 mm, and the thickness of the piezoelectric detection body 71 is approximately 200 μm. As one example, the piezoelectric detection body 71 has a square plate shape in which a width in the X-axis direction and a width in the Y-axis direction are substantially the same. As one example, each of the thickness of the electrode 72 and the thickness of the electrode 73 is 1 to 2 μm.

A width of the electrode 72 in the X-axis direction is smaller than the width of the piezoelectric detection body 71 in the X-axis direction, and a width of the electrode 72 in the Y-axis direction is smaller than the width of the piezoelectric detection body 71 in the Y-axis direction. In addition, when viewed in the Z-axis direction, an outer edge 72*c* of the electrode 72 (outer edge corresponding to a side surface 72*b* of the electrode 72) is located inside the outer edge 71*d* of the piezoelectric detection body 71. "When viewed in the Z-axis direction, the outer edge 72*c* of the electrode 72 is located inside the outer edge 71*d* of the piezoelectric detection body 71" means that the outer edge 71*d* of the piezoelectric detection body 71 surrounds the outer edge 72*c* of the electrode 72 when viewed in the Z-axis direction. Namely, when viewed in the Z-axis direction, the outer edge 72*c* is offset from the outer edge 71*d* to a center side of the piezoelectric detection body 71. As one example, a distance between the outer edge 72*c* and the outer edge 71*d* when viewed in the Z-axis direction is larger than the thickness of the piezoelectric detection body 71. The distance between the outer edge 72*c* and the outer edge 71*d* is, for example, approximately 250 μm similarly to the distance between the outer edge 62*c* and the outer edge 61*d*. Incidentally, for example, in a case where the electrode 72 has a square plate shape when viewed in the Z-axis direction, the distance between the outer edge 72*c* and the outer edge 71*d* may smaller than the distance between the outer edge 62*c* and the outer edge 61*d* when viewed in the Z-axis direction. The reason is that the amount and the range of protrusion of the bonding member 8B from the piezoelectric detection body 71 (and the electrode 73) having a square plate shape are more easily controlled when compared to a case where the piezoelectric detection body 71 has an oblong plate shape. In addition, when the piezoelectric detection body 71 has a square plate shape, since the amount and the range of protrusion of the bonding member 8B from the piezoelectric detection body 71 are easily controlled, the bonding member 8B is easily disposed over the entirety of the corner C2. In the present embodiment, the distance between the outer edge 72c and the outer edge 71d when viewed in the Z-axis direction is longer than a distance between the highest edge portion of the fourth portion 84 and the outer edge 711 of the third main surface 71a when seen in the X-axis direction. According to this configuration, it is possible to reliably prevent the bonding member 8B having conductivity from coming into contact with the electrode 72. The distance between the highest edge portion of the fourth portion 84 and the outer edge 711 when seen in the X-axis direction is, for example, approximately 50 μm.

The width of the piezoelectric detection body 71 in the X-axis direction is smaller than the width of the piezoelectric drive body 61 in the X-axis direction, and the width of the piezoelectric detection body 71 in the Y-axis direction is smaller than the width of the piezoelectric drive body 61 in the Y-axis direction. In addition, when viewed in the Z-axis direction, the outer edge 71d of the piezoelectric detection body 71 is located inside the outer edge 61d of the piezoelectric drive body 61. "When viewed in the Z-axis direction, the outer edge 71d of the piezoelectric detection body 71 is located inside the outer edge 61d of the piezoelectric drive body 61" means that the outer edge 61d of the piezoelectric drive body 61 surrounds the outer edge 71d of the piezoelectric detection body 71 when viewed in the Z-axis direction. Namely, when viewed in the Z-axis direction, the outer edge 71d is offset from the outer edge 61d to the center side of the piezoelectric detection body 71.

Figure 3:
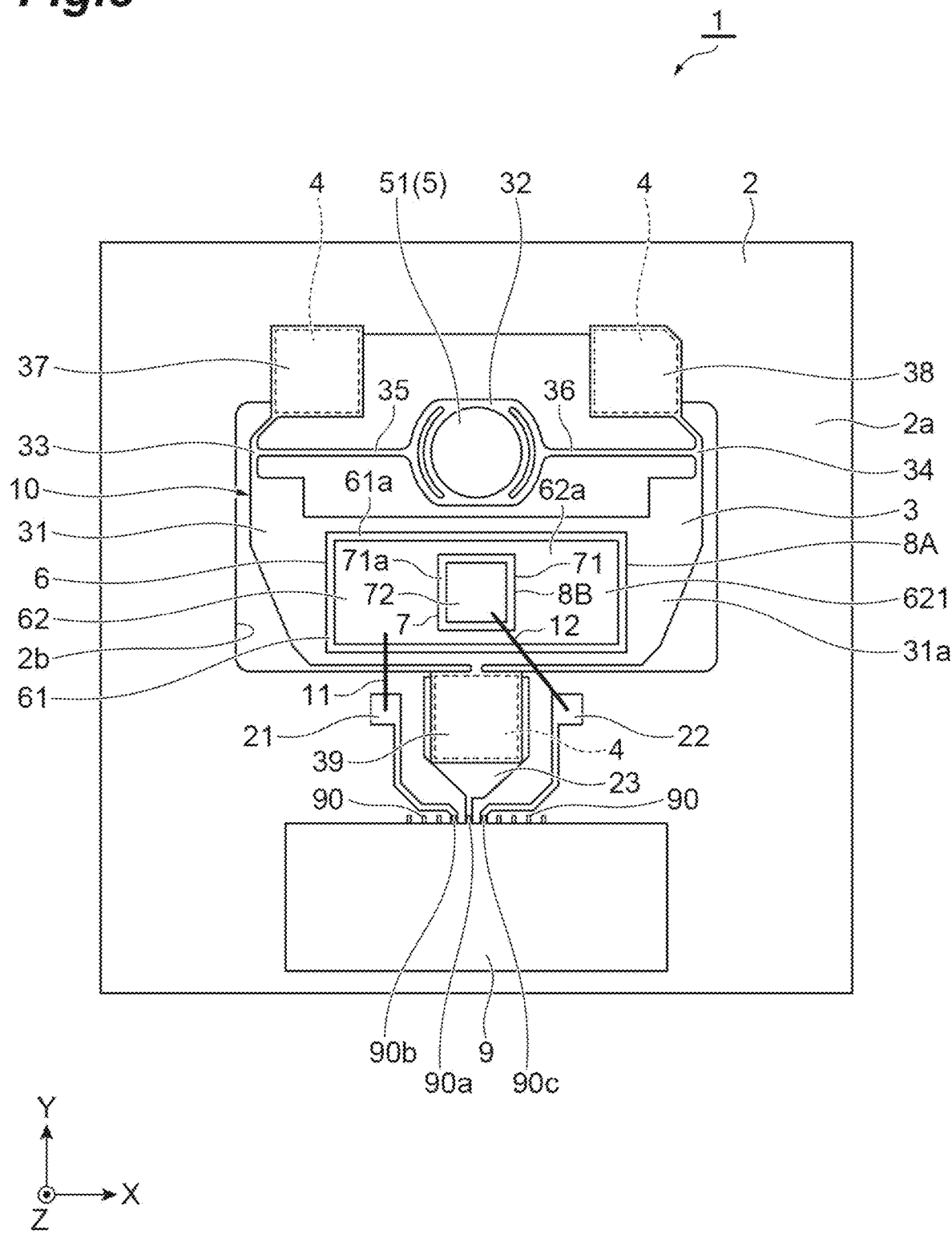
FIG. 3 is a plan view of the actuator device illustrated in FIG. 1.
Figure 4:
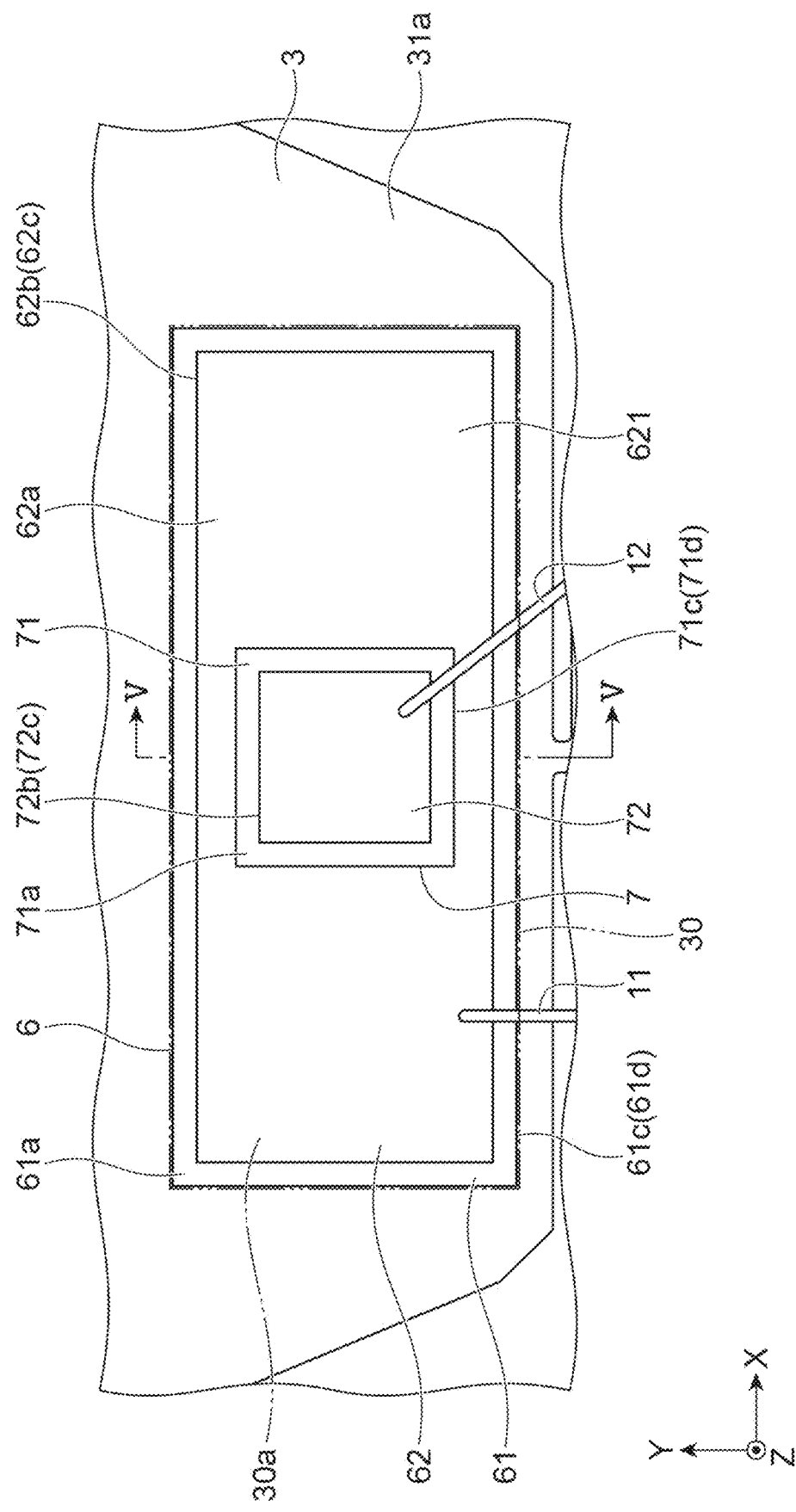
FIG. 4 is a plan view of a portion of a metal substrate, a piezoelectric drive element, and a piezoelectric detection element illustrated in FIG. 3.

In the present embodiment, as illustrated in FIGS. 3 and 4, the piezoelectric drive body 61 and the piezoelectric detection body 71 are disposed such that a center point of the piezoelectric drive body 61 and a center point of the piezoelectric detection body 71 coincide with each other when viewed in the Z-axis direction. When viewed in the Z-axis direction, the piezoelectric drive body 61 is disposed to be axisymmetric with respect to a straight line passing through the center point of the piezoelectric drive body 61 along the X-axis direction, and to be axisymmetric with respect to a straight line passing through the center point of the piezoelectric drive body 61 in the Y-axis direction. When viewed in the Z-axis direction, the piezoelectric detection body 71 is disposed to be axisymmetric with respect to a straight line passing through the center point of the piezoelectric detection body 71 along the X-axis direction, and to be axisymmetric with respect to a straight line passing through the center point of the piezoelectric detection body 71 in the Y-axis direction. The Y-axis direction is a direction in which the main body portion 31 and the movable portion are arranged.

As illustrated in FIG. 5, the actuator device 1 further includes the first electrode unit 13, a second electrode unit 14, and a third electrode unit 15. The first electrode unit 13 is provided to the metal substrate 3. The first electrode unit 13 includes the conductive portion 30, the bonding member 8A, and the electrode 63 of the piezoelectric drive element 6. In the present embodiment, the first electrode unit 13 includes the conductive portion 30, at least a part of the bonding member 8A, and the electrode 63. At least the part of the bonding member 8A is, for example, a portion (namely, the first portion 81) of the bonding member 8A which is disposed between the conductive portion 30 and the electrode 63. In the first electrode unit 13, the electrode 63 and the conductive portion 30 are bonded by the bonding member 8A. The piezoelectric drive body 61 is disposed on the first electrode unit 13. The second electrode unit 14 is disposed on the first main surface 61a of the piezoelectric drive body 61. The first main surface 61a is a main surface opposite the first electrode unit 13, and the second main surface 61b is a main surface on a first electrode unit 13 side. The second electrode unit 14 includes the electrode 62 of the piezoelectric drive element 6, the bonding member 8B, and the electrode 73 of the piezoelectric detection element 7. In the present embodiment, the second electrode unit 14 includes the electrode 62, at least a part of the bonding member 8B, and the electrode 73. At least the part of the bonding member 8B is, for example, a portion (namely, the third portion 83) of the bonding member 8B which is disposed between the electrode 62 and the electrode 73. In the second electrode unit 14, the electrode 62 and the electrode 73 are bonded by the bonding member 8B. The piezoelectric detection body 71 is disposed on the second electrode unit 14. The third electrode unit 15 is disposed on the third main surface 71a of the piezoelectric detection body 71. The third main surface 71a is a main surface opposite the second electrode unit 14, and the fourth main surface 71b is a main surface on a second electrode unit 14 side. The third electrode unit 15 includes the electrode 72 of the piezoelectric detection element 7. In the present embodiment, the third electrode unit 15 is formed of the electrode 72. As described above, the piezoelectric drive body 61 is disposed between the first electrode unit 13 and the second electrode unit 14, and the piezoelectric detection body 71 is disposed between the second electrode unit 14 and the third electrode unit 15.

As illustrated in FIG. 1, the actuator device 1 further includes an input unit 91, a connection unit 92, and an output unit 93. The input unit 91, the connection unit 92, and the output unit 93 are housed in the connector 9.

The input unit 91 is configured to input the drive signal S1 to drive the piezoelectric drive body 61, to the first electrode unit 13 from the control unit 20. Specifically, the input unit 91 is a terminal in the connector 9 which electrically connects the control unit 20 and the first electrode unit 13 to input the drive signal S1 to the first electrode unit 13 (details will be described later). The input unit 91 is electrically connected to a terminal 90a (refer to FIG. 3) included in the plurality of terminals 90. In addition, the input unit 91 is electrically connected to the control unit 20 via, for example, the flexible printed substrate and the like. The connection unit 92 is configured to be connected to a reference potential (fixed potential) outside the actuator device 1. Specifically, the connection unit 92 is a terminal in the connector 9 which electrically connects the reference potential and the second electrode unit 14 such that the potential of the second electrode unit 14 becomes the reference potential by electrical connection between the second electrode unit 14 and the reference potential. The connection unit 92 is electrically connected to a terminal 90b (refer to FIG. 3) included in the plurality of terminals 90. In addition, the connection unit 92 is connected to, for example, a reference potential inside the actuator system 100 via, for example, the flexible printed substrate and the like. Incidentally, the connection unit 92 may be connected to a reference potential outside the actuator system 100. The output unit 93 is configured to output the output signal S2 generated in the piezoelectric detection body 71, to the outside from the third electrode unit 15. Specifically, the output unit 93 is a terminal in the connector 9 which electrically connects the control unit 20 and the third electrode unit 15 to output the output signal S2 generated in the third electrode unit 15, to the control unit 20

(details will be described later). The output unit 93 is electrically connected to a terminal 90c (refer to FIG. 3) included in the plurality of terminals 90.

[Electrical Connection Relationship of Actuator System]

Figure 2:
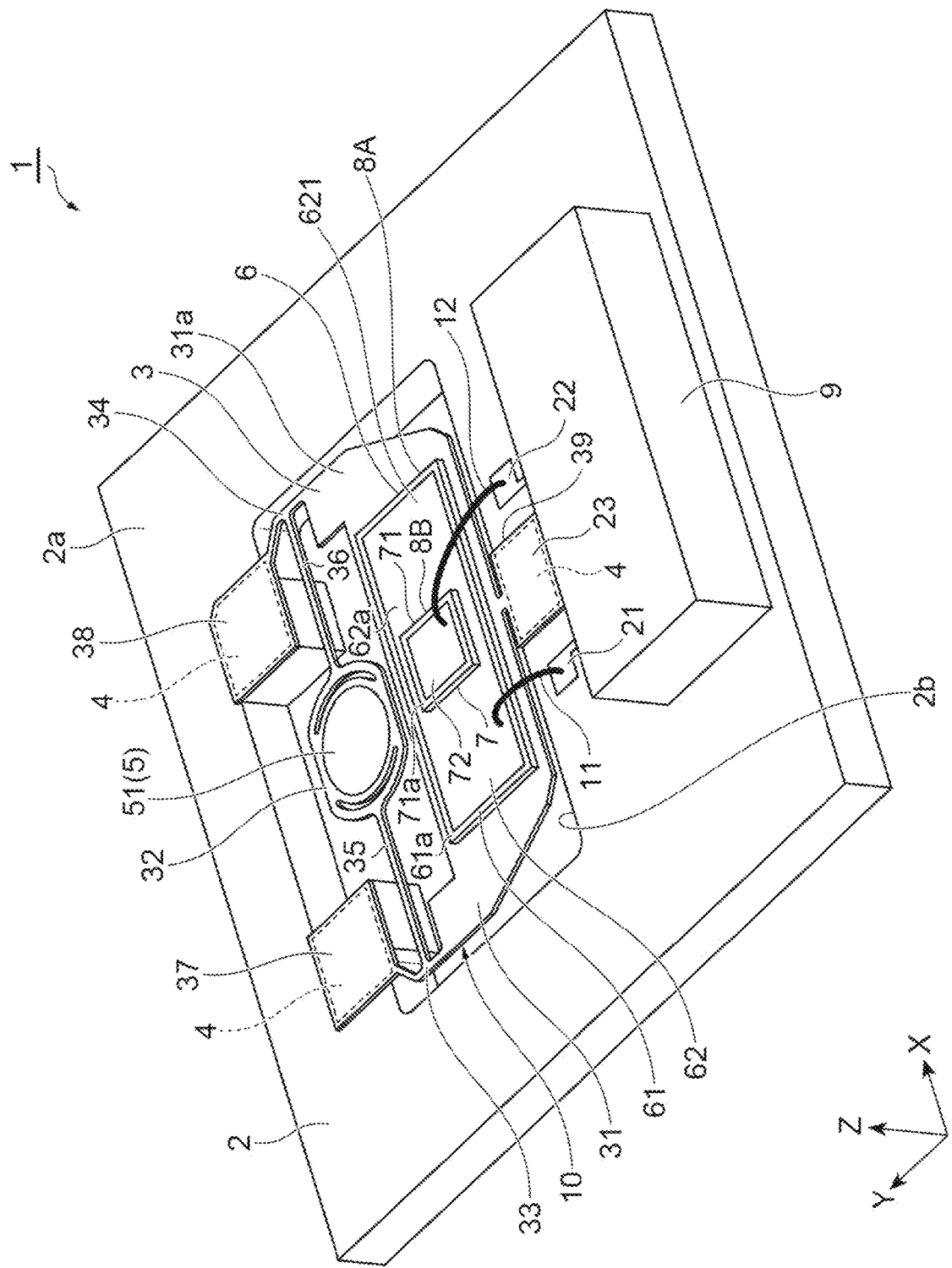
FIG. 2 is a perspective view of an actuator device illustrated in FIG. 1.

The first electrode unit 13 is electrically connected to the electrode pad 23. Specifically, as illustrated in FIGS. 2, 3, and 5, the conductive portion 30, at least a part of the bonding member 8A, and the electrode 63 of the piezoelectric drive element 6 that form the first electrode unit 13 are electrically connected to the electrode pad 23 via the metal substrate 3 and the bonding member 4 disposed between the third connection portion 39 of the metal substrate 3 and the electrode pad 23. The electrode pad 23 is electrically connected to the input unit 91 via a wiring of the wiring substrate 2 and the terminal 90a of the connector 9. The electrode pad 23 is located on the placement surface 2a (specifically, a region on the placement surface 2a which faces the metal substrate 3) among surfaces of the wiring substrate 2. Namely, the first electrode unit 13 is electrically connected to the input unit 91 of the connector 9 via the metal substrate 3, the bonding member 4, the electrode pad 23, the wiring of the wiring substrate 2, and the terminal 90a. In addition, the input unit 91 is electrically connected to the control unit 20 via, for example, the flexible printed substrate and the like. Namely, the input unit 91 electrically connects the control unit 20 and the first electrode unit 13.

The second electrode unit 14 is electrically connected to the electrode pad 21. Specifically, the electrode 62, at least a part of the bonding member 8B, and the electrode 73 that form the second electrode unit 14 are electrically connected to the electrode pad 21 via the wire 11. The wire 11 is bridged between the electrode 62 of the second electrode unit 14 and the electrode pad 21. Specifically, the wire 11 is bridged between a region 621 on the surface 62a of the electrode 62 and the electrode pad 21. The region 621 is a region that is located on the surface 62a of the electrode 62 outside the piezoelectric detection body 71 when viewed in the Z-axis direction. The electrode pad 21 is located at a region in a surface of the wiring substrate 2, the region being where the electrode 62 is disposed with respect to the metal substrate 3 in the Z-axis direction (namely, in the placement surface 2a). The electrode pad 21 is electrically connected to the connection unit 92 via a wiring of the wiring substrate 2 and the terminal 90b of the connector 9. Namely, the second electrode unit 14 is electrically connected to the connection unit 92 of the connector 9 via the wire 11, the electrode pad 21, the wiring of the wiring substrate 2, and the terminal 90b. In addition, the connection unit 92 is connected to the reference potential (for example, a ground potential) inside the actuator system 100 via, for example, the flexible printed substrate and the like. Namely, the connection unit 92 electrically connects the control unit 20 and the second electrode unit 14.

The third electrode unit 15 is electrically connected to the electrode pad 22. Specifically, the electrode 72 of the piezoelectric detection element 7 forming the third electrode unit 15 is electrically connected to the electrode pad 22 via the wire 12. The wire 12 is bridged between the electrode 72 of the third electrode unit 15 and the electrode pad 22. The electrode pad 22 is located at a region in a surface of the wiring substrate 2, the region being where the electrode 72 is disposed with respect to the metal substrate 3 in the Z-axis direction (namely, in the placement surface 2a). The electrode pad 22 is electrically connected to the terminal 90c of the connector 9 via a wiring of the wiring substrate 2. Namely, the third electrode unit 15 is electrically connected to the output unit 93 of the connector 9 via the wire 12, the electrode pad 22, the wiring of the wiring substrate 2, and the terminal 90c. In addition, the output unit 93 is electrically connected to the control unit 20 via, for example, the flexible printed substrate and the like. Namely, the output unit 93 electrically connects the control unit 20 and the third electrode unit 15.

The actuator device 1 is driven, for example, as follows according to the above-described electrical connection relationship. Specifically, in a state where the second electrode unit 14 (specifically, the electrode 62 of the piezoelectric drive element 6, at least a part of the bonding member 8B, and the electrode 73 of the piezoelectric detection element 7) is connected to the reference potential via the wire 11, the electrode pad 21, the wiring of the wiring substrate 2, and the terminal 90b and the connection unit 92 of the connector 9, and the potential of the second electrode unit 14 is the reference potential, the drive signal S1 that is a voltage signal to cause a resonant operation of the movable portion 32 of the actuator device 1 is input to the first electrode unit 13 (specifically, the conductive portion 30, at least a part of the bonding member 8A, and the electrode 63 of the piezoelectric drive element 6) from the control unit 20 via the input unit 91 of the connector 9 and the terminal 90a of the connector 9, the wiring of the wiring substrate 2, the electrode pad 23, the bonding member 4, and the metal substrate 3. Accordingly, the piezoelectric drive body 61 deforms and/or vibrates to generate periodic plate waves in the main body portion 31. Because of the generation of the periodic plate waves, torsional vibration (torsional resonance) is induced in the first coupling portion 35 and in the second coupling portion 36, and the movable portion 32 and the optical surface 51 oscillate. Namely, in the actuator device 1, while a torsional resonance system formed of the first coupling portion 35, the second coupling portion 36, the movable portion 32, and the optical surface 51 and the piezoelectric drive element 6 are disposed at separate positions, a Lamb wave resonance system is adopted, so that torsional resonance is generated with high driving efficiency. On the other hand, the output signal S2 generated in the piezoelectric detection body 71 is output to the control unit 20 from the third electrode unit 15 (specifically, the electrode 72 of the piezoelectric detection element 7) via the wire 12, the electrode pad 22, the wiring of the wiring substrate 2, the terminal 90c of the connector 9, and the output unit 93 of the connector 9, and an oscillation angle of the optical surface 51 and a phase of the optical surface 51 are detected. The output signal S2 is a voltage signal corresponding to a change in angle and phase caused by oscillation of the movable portion 32 and the optical surface 51. In addition, when viewed in the Z-axis direction, the center point of the piezoelectric drive body 61 and the center point of the piezoelectric detection body 71 coincide with each other. Then, the piezoelectric drive body 61 is disposed to be axisymmetric with respect to both the straight line passing through the center point of the piezoelectric drive body 61 along the X-axis direction and the straight line passing through the center point of the piezoelectric drive body 61 along the Y-axis direction, and the piezoelectric detection body 71 is disposed to be axisymmetric with respect to both the straight line passing through the center point of the piezoelectric detection body 71 along the X-axis direction and the straight line passing through the center point of the piezoelectric detection body 71 along the Y-axis direction. Since the piezoelectric drive body 61 and the piezoelectric detection body 71 have the above-described positional relationship, in the actuator device 1, when the drive signal S1 is input to the first electrode unit 13, the movement of the piezoelectric drive body 61 and the movement of the piezoelectric detection body 71 coincide with each other.

[Configuration of Control Unit]

The control unit 20 generates the drive signal S1 of a sine wave to cause the movable portion 32 to resonantly vibrate, and inputs the generated drive signal S1 to the input unit 91 of the connector 9. In addition, the control unit 20 acquires the output signal S2 of a sine wave output from the output unit 93. Then, the control unit 20 repeats a process in which the acquired output signal S2 is processed and the drive signal S1 is generated again based on a result of processing the output signal S2. Here, the phase of the movable portion 32 that oscillates when the drive signal S1 is input to the input unit 91 is a difference between a phase of the drive signal S1 and a phase of a signal indicating a displacement of the movable portion 32 on the same time axis. Namely, the phase of the movable portion 32 indicates how much the phase indicating the displacement of the movable portion 32 is delayed with respect to the drive signal S1, for example, the phase is delayed by 10°.

Frequency and amplitude conditions of the drive signal S1 to cause a resonant operation of the movable portion 32 are actually changed depending on a change in operating temperature of the actuator device 1. Therefore, in order to cause a resonant operation of the movable portion 32, the frequency and the amplitude of the drive signal S1 need to be appropriately changed according to a change in the operating temperature. Therefore, the control unit 20 generates the drive signal S1 appropriate for causing the movable portion 32 to resonantly vibrate, based on the output signal S2 generated in the piezoelectric detection body 71. Here, the output signal S2 generated in the piezoelectric detection body 71 actually includes not only a resonant signal corresponding to an oscillation angle and a phase of the movable portion 32, but also a static strain signal. Namely, not only the vibration and torsion of the movable portion 32 caused by resonance but also a static strain from the piezoelectric drive body 61 propagate to the piezoelectric detection body 71, and the output signal S2 includes the resonant signal and the static strain signal. "The static strain from the piezoelectric drive body 61" does not mean only a static strain of the piezoelectric drive body 61 itself resulting from the input of the drive signal S1, but also a static strain of the entirety of the actuator device 1 which propagates from the piezoelectric drive body 61 to the piezoelectric detection body 71. Specifically, when the drive signal S1 is input and a static strain is generated in the piezoelectric drive body 61, the static strain propagates to the metal substrate 3 and the like, thereby also distorting members being different from the piezoelectric drive body 61. Then, the static strain of the other members and the static strain of the piezoelectric drive body 61 itself propagate from the piezoelectric drive body 61 to the piezoelectric detection body 71, so that the piezoelectric detection body 71 detects the output signal S2 including the static strain signal from the piezoelectric drive body 61. Therefore, in the actuator system 100, the control unit 20 executes a process of generating a resonant signal of the movable portion 32 by generating an estimated static strain signal estimated to be included in the output signal S2 and by subtracting the generated estimated static strain signal from the output signal S2. Accordingly, the control unit 20 can generate the drive signal S1 appropriate for causing the movable portion 32 to resonantly vibrate, based on the resonant signal of the movable portion 32.

As illustrated in FIG. 1, the control unit 20 includes a signal processing unit 201, a generation unit 202, an adjustment amplifier 203, an adjustment amplifier 204, and a differential amplifier 205. The signal processing unit 201 determines an amplitude and a frequency of the drive signal S1 to be input to the actuator device 1. Specifically, the signal processing unit 201 maintains the resonant operation of the movable portion 32 and determines an amplitude and a frequency to bring the swing angle of the movable portion 32 close to a target angle, based on a resonant signal S4 (details will be described later) acquired from the differential amplifier 205. The signal processing unit 201 is, for example, a microcontroller, a field programmable gate array (FPGA), or the like. The generation unit 202 generates a signal that provides a basis for the drive signal S1. The signal that provides a basis has the frequency determined by the signal processing unit 201. The generation unit 202 is, for example, a direct digital synthesizer (DDS), a voltage-controlled oscillator (VCO), or the like. For example, the adjustment amplifier 203 adjusts the signal generated by the generation unit 202 such that the signal has the amplitude determined by the signal processing unit 201. Accordingly, the drive signal S1 of a sine wave is generated. The drive signal S1 is input to the input unit 91 of the connector 9.

In addition, the signal processing unit 201 determines an amplitude and a frequency of the estimated static strain signal estimated to be included in the output signal S2, based on the determined amplitude and frequency of the drive signal S1 and signal data acquired by a pre-inspection. The signal data is data indicating a voltage value of the static strain signal from the piezoelectric drive body 61 for each voltage value of the drive signal S1, and is stored in advance in, for example, a storage unit (not illustrated) included in the control unit 20. Then, the generation unit 202 generates a signal that provides a basis for the estimated static strain signal, based on the amplitude and the frequency determined by the signal processing unit 201. The signal that provides a basis has the frequency determined by the signal processing unit 201. Then, the adjustment amplifier 204 adjusts the signal generated by the generation unit 202 such that the signal has the amplitude determined by the signal processing unit 201. Accordingly, an estimated static strain signal S3 of a sine wave is generated. The generated estimated static strain signal S3 is input to the differential amplifier 205.

Signal data used to generate the estimated static strain signal S3 is acquired in advance by an inspection process performed before shipment and/or a pre-inspection performed at a start-up of the actuator device 1. In the pre-inspection, a voltage value of the static strain signal from the piezoelectric drive body 61 is acquired for each voltage value of the drive signal by driving the actuator device 1 at a frequency that is sufficiently lower than the resonant frequency of the movable portion 32. The frequency that is sufficiently lower than the resonant frequency of the movable portion 32 has, for example, a value equal to or less than 50% of the resonant frequency of the movable portion 32. The resonant frequency of the movable portion 32 is, for example, approximately 600 Hz. The frequency that is sufficiently lower than the resonant frequency of the movable portion 32 is, for example, approximately 50 to 100 Hz. In the pre-inspection, the actuator device 1 is driven at the frequency that is sufficiently lower than the resonant frequency of the movable portion 32 (namely, the frequency of the drive signal to be input to the piezoelectric drive body 61 is set to a value equal to or less than 50% of the resonant frequency of the movable portion 32), so that the output signal detected by the piezoelectric detection body 71 is acquired as a static strain signal. Namely, when the frequency of the drive signal input to the piezoelectric drive body 61 is equal to or less than 50% of the resonant frequency of the movable portion 32, the static strain signal is a voltage signal detected by the piezoelectric detection body. Accordingly, a voltage value of the static strain signal from the piezoelectric drive body 61 is acquired for each voltage value of the drive signal S1.

The estimated static strain signal S3 and the output signal S2 from the output unit 93 of the connector 9 are input to the differential amplifier 205. As described above, in the present embodiment, the movement of the piezoelectric drive body 61 and the movement of the piezoelectric detection body 71 coincide with each other. Therefore, the differential amplifier 205 generates the resonant signal S4 of the movable portion 32 by subtracting the estimated static strain signal S3 from the output signal S2 instead of performing a correction process of fitting the generated estimated static strain signal S3 to the phase of the output signal S2. The generated resonant signal S4 is input to the signal processing unit 201.

The control unit 20 further includes a drive signal generation unit 20A and an output signal processing unit 20B. The drive signal generation unit 20A generates the drive signal S1. The drive signal generation unit 20A includes, for example, the generation unit 202 and the adjustment amplifier 203. The output signal processing unit 20B processes the output signal S2. Specifically, the output signal processing unit 20B generates the estimated static strain signal S3 of the piezoelectric drive body 61 based on information related to the frequency and the amplitude of the drive signal S1, and generates the resonant signal S4 of the movable portion 32 based on the output signal S2 and the estimated static strain signal S3. The output signal processing unit 20B includes, for example, the adjustment amplifier 204 and the differential amplifier 205. As described above, the control unit 20 generates the drive signal S1 appropriate for causing the movable portion 32 to resonantly vibrate, based on the output signal S2 generated in the piezoelectric detection body 71, and inputs the appropriate drive signal S1 to the actuator device 1. Accordingly, the appropriate drive signal S1 is input to the actuator device 1.

[Actions and Effects]

In the actuator device 1, the piezoelectric drive body 61, the second electrode unit 14, the piezoelectric detection body 71, and the third electrode unit 15 are stacked on top of each other in order on the first electrode unit 13 provided to the metal substrate 3. Since the piezoelectric drive body 61 and the piezoelectric detection body 71 are stacked on top of each other on the same side with respect to the metal substrate 3 in such a manner, a variation in the relative positional relationship between the piezoelectric drive body 61 and the piezoelectric detection body 71 is unlikely to occur. Therefore, according to the actuator device 1 and the actuator system 100 including the actuator device 1, it is possible to accurately detect an operation amount of the movable portion 32.

For example, in a related art example where the piezoelectric drive body 61 is disposed on the main surface 31a of the metal substrate 3 and the piezoelectric detection body 71 is disposed on a surface on an opposite side of the metal substrate 3 from the main surface 31a (hereinafter, referred to as "Related Art Example 1"), each of the piezoelectric drive body 61 and the piezoelectric detection body 71 is disposed with respect to the metal substrate 3. Therefore, a variation in a positional relationship between the piezoelectric drive body 61 and the piezoelectric detection body 71 is likely to occur, so that a variation in a phase difference between the output signal S2 and the estimated static strain signal S3 is also likely to occur. For this reason, in Related Art Example 1, the resonant signal S4 obtained by subtracting the estimated static strain signal S3 from the output signal S2 is shifted from an actual resonant signal corresponding to an actual oscillation angle (amplitude) and/or phase of the movable portion 32, and the accuracy of the resonant signal S4 decreases. In addition, for example, also, in a related art example where the piezoelectric drive body 61 and the piezoelectric detection body 71 are disposed on the main surface 31a of the metal substrate 3 not to overlap each other when viewed in the Z-axis direction (hereinafter, referred to as "Related Art Example 2"), since each of the piezoelectric drive body 61 and the piezoelectric detection body 71 is disposed with respect to the main surface 31a, for the same reason as in Related Art Example 1, the accuracy of the resonant signal S4 decreases. Further, in Related Art Example 2, since the piezoelectric drive body 61 and the piezoelectric detection body 71 do not overlap each other, the phase difference between the output signal S2 and the estimated static strain signal S3 always varies, and it is difficult to perform a process of subtracting the estimated static strain signal S3 from the output signal S2, or a process of correcting the phase difference becomes complicated.

In contrast, in the actuator device 1, the piezoelectric drive body 61 and the piezoelectric detection body 71 are stacked on top of each other on the same side with respect to the metal substrate 3. Accordingly, since a variation in the positional relationship between the piezoelectric drive body 61 and the piezoelectric detection body 71 is unlikely to occur, the phase difference between the output signal S2 and the estimated static strain signal S3 is also unlikely to vary. Therefore, it is possible to accurately obtain the resonant signal S4 by subtracting the estimated static strain signal S3 from the output signal S2. Therefore, according to the actuator device 1 and the actuator system 100, it is possible to accurately detect an oscillation angle and a phase that are an operation amount of the movable portion 32.

Further, in the actuator device 1, the piezoelectric drive body 61 and the piezoelectric detection body 71 are disposed such that when viewed in the Z-axis direction, the center point of the piezoelectric drive body 61 and the center point of the piezoelectric detection body 71 coincide with each other, the piezoelectric drive body 61 is axisymmetric with respect to both the straight line passing through the center point of the piezoelectric drive body 61 along the X-axis direction and the straight line passing through the center point of the piezoelectric drive body 61 along the Y-axis direction, and the piezoelectric detection body 71 is axisymmetric with respect to both the straight line passing through the center point of the piezoelectric detection body 71 along the X-axis direction and the straight line passing through the center point of the piezoelectric detection body 71 along the Y-axis direction. Accordingly, since the movement of the piezoelectric drive body 61 and the movement of the piezoelectric detection body 71 coincide with each other, the phases of the output signal S2 and the estimated static strain signal S3 coincide with each other. Accordingly, for example, a correction process of causing the phase of the estimated static strain signal S3 and the phase of the output signal S2 to coincide with each other is not required, and the resonant signal S4 can be obtained by a simple process of simply subtracting the generated estimated static strain signal S3 from the output signal S2. In addition, since the movement of the piezoelectric drive body 61 and the movement of the piezoelectric detection body 71 coincide with each other, the phases of the drive signal S1 and the estimated static strain signal S3 also coincide with each other, the process of correcting the generated estimated static strain signal S3 is not required, and the estimated static strain signal S3 can be generated by a simple process. Particularly, the actuator device 1 in which the metal substrate 3 is used is characterized in that the actuator device 1 is better in processing efficiency and is cheaper than an actuator device in which a silicon is used, and in order to lower the total cost of the actuator device 1, it is important to simplify the circuit design.

Incidentally, in Related Art Example 1, even when positioning is performed such that the center point of the piezoelectric drive body 61 and the center point of the piezoelectric detection body 71 coincide with each other, the piezoelectric drive body 61 is axisymmetric with respect to both the straight line passing through the center point of the piezoelectric drive body 61 along the X-axis direction and the straight line passing through the center point of the piezoelectric drive body 61 along the Y-axis direction, and the piezoelectric detection body 71 is axisymmetric with respect to both the straight line passing through the center point of the piezoelectric detection body 71 along the X-axis direction and the straight line passing through the center point of the piezoelectric detection body 71 along the Y-axis direction, for the same reason described above, actually, a variation in the relative positional relationship between the piezoelectric drive body 61 and the piezoelectric detection body 71 occurs, and eventually, a variation in the phase difference between the output signal S2 and the estimated static strain signal S3 occurs. Therefore, the accuracy of the resonant signal S4 decreases, and it is difficult to accurately detect an oscillation angle and a phase of the movable portion 32. In addition, also, in the process of generating the estimated static strain signal S3, in Related Art Example 1, because of a variation in the relative positional relationship between the piezoelectric drive body 61 and the piezoelectric detection body 71, a variation in the phase difference between the drive signal S1 and the estimated static strain signal S3 also occurs, and as a result, the accuracy of the generated estimated static strain signal S3 decreases, and it is more difficult to accurately detect an oscillation angle and a phase of the movable portion 32, or the process of correcting the estimated static strain signal S3 is required, so that the process becomes complicated.

In addition, in Related Art Example 1, the piezoelectric drive body 61 is disposed on the main surface 31a of the metal substrate 3, and the piezoelectric detection body 71 is disposed on the surface opposite the main surface 31a. Therefore, wires from an electrode unit on a piezoelectric drive body 61 side need to be wired on a main surface 31a side, and wires from an electrode unit from a piezoelectric detection body 71 side need to be wired on the surface opposite the main surface 31a, so that the wiring structure becomes complicated. In contrast, in the actuator device 1, since both the piezoelectric drive body 61 and the piezoelectric detection body 71 are disposed on one side (main surface 31a side) with respect to the metal substrate 3, it is possible to simplify the wiring structure.

In addition, in Related Art Example 1, the piezoelectric drive body 61 is disposed on the main surface 31a of the metal substrate 3, and the piezoelectric detection body 71 is disposed on the surface opposite the main surface 31a, and in Related Art Example 2, both the piezoelectric drive body 61 and the piezoelectric detection body 71 are disposed on the main surface 31a of the metal substrate 3 not to overlap each other, whereas in the actuator device 1, since both the piezoelectric drive body 61 and the piezoelectric detection body 71 are stacked on top of each other on one side with respect to the metal substrate 3, it is possible to save the space of the metal substrate 3. Therefore, according to the actuator device 1, it is possible to reduce the size of the entire device. In addition, when the actuator device 1 is driven at a frequency that is sufficiently lower than the resonant frequency of the movable portion 32, to acquire a voltage value of the static strain signal in the above-described pre-inspection, if the amplitude of the voltage of the static strain signal is small, the voltage value (calibration curve) of the static strain signal may be affected by noise and not accurately obtained. In this regard, in the actuator device 1, since the piezoelectric detection body 71 is disposed on the piezoelectric drive body 61, it is possible to obtain a large amplitude of the static strain signal (reference signal amplitude), and it is possible to improve the accuracy of the voltage value of the static strain signal, and eventually, the control accuracy of the actuator device 1.

The actuator device 1 includes the connector 9 being disposed on the wiring substrate 2 and housing the connection unit 92, the input unit 91, and the output unit 93. Accordingly, it is possible to simply and reliably perform electrical connection between each of the first electrode unit 13, the second electrode unit 14, and the third electrode unit 15 and the control unit 20.

In the actuator device 1, when viewed in the Z-axis direction, the outer edge 71d of the piezoelectric detection body 71 is located inside the outer edge 61d of the piezoelectric drive body 61. Accordingly, since it is possible to dispose the piezoelectric detection body 71 while seeing the piezoelectric drive body 61 during manufacturing, it is possible to perform positioning between the piezoelectric drive body 61 and the piezoelectric detection body 71 with higher accuracy.

In the actuator device 1, the first electrode unit 13 includes the electrode 63 disposed on the second main surface 61b. Accordingly, it is possible to uniformly apply a drive voltage to the second main surface 61b of the piezoelectric drive body 61, and it is possible to improve the driving efficiency.

The actuator device 1 includes the bonding member 4 having conductivity. The first electrode unit 13 further includes the conductive portion 30 and the bonding member 8A having conductivity. The wiring substrate 2 includes the electrode pad 23 electrically connected to the input unit 91. The electrode pad 23 is provided to the placement surface 2a of the wiring substrate 2. The bonding member 4 bonds the metal substrate 3 and the electrode pad 23. The bonding member 8A bonds the electrode 63 and the conductive portion 30. Accordingly, it is possible to electrically connect the first electrode unit 13 and the input unit 91 with simplicity and reliability.

In the actuator device 1, the second electrode unit 14 includes the electrode 62 disposed on the first main surface 61a. Accordingly, it is possible to uniformly apply a drive voltage to the first main surface 61a of the piezoelectric drive body 61, and it is possible to improve the driving efficiency.

The actuator device 1 includes the wire 11, the wiring substrate 2 includes the electrode pad 21 electrically connected to the connection unit 92, the electrode pad 21 is provided to the placement surface 2a of the wiring substrate 2, and the wire 11 is bridged between the electrode 62 and the electrode pad 21. Accordingly, it is possible to electrically connect the second electrode unit 14 and the connection unit 92 with simplicity and reliability.

In the actuator device 1, the electrode 62 includes the region 621 located outside the piezoelectric detection body 71 when viewed in the Z-axis direction, and the wire 11 is bridged between the region 621 and the electrode pad 21.

Accordingly, with a simple configuration, it is possible to electrically connect the second electrode unit 14 disposed between the piezoelectric drive body 61 and the piezoelectric detection body 71, to the connection unit 92.

In the actuator device 1, the second electrode unit 14 includes the electrode 73 disposed on the fourth main surface 71*b*, and the bonding member 8B having conductivity, and the bonding member 8B bonds the electrode 62 and the electrode 73. Accordingly, with a simple configuration, it is possible to realize the input of the desired drive signal S1 to the piezoelectric drive body 61 and the highly accurate detection of the output signal S2 generated in the piezoelectric detection body 71.

The actuator device 1 includes the wire 12, the third electrode unit 15 includes the electrode 72 disposed on the third main surface 71*a*, the wiring substrate 2 includes the electrode pad 22 electrically connected to the output unit 93, the electrode pad 22 is provided to the placement surface 2*a* of the wiring substrate 2, and the wire 12 is bridged between the electrode 72 and the electrode pad 22. Accordingly, it is possible to electrically connect the third electrode unit 15 and the output unit 93 with simplicity and reliability.

In the actuator device 1, the piezoelectric body on a metal substrate 3 side disposed between the first electrode unit 13 and the second electrode unit 14 is the piezoelectric drive body 61, the piezoelectric body opposite the metal substrate 3 which is disposed between the second electrode unit 14 and the third electrode unit 15 is the piezoelectric detection body 71, the first electrode unit 13 is electrically connected to the input unit 91, and the third electrode unit 15 is electrically connected to the output unit 93. Accordingly, since it is easy for vibration of the piezoelectric drive body 61 to appropriately propagate to the metal substrate 3, it is possible to obtain a desired driving characteristic.

In the actuator system 100, the drive signal generation unit 20A generates the drive signal S1 to cause a resonant operation of the movable portion 32, and the output signal processing unit 20B generates the estimated static strain signal S3 estimated to be included in the output signal S2, based on information related to the frequency and the amplitude of the drive signal S1, and generates the resonant signal S4 of the movable portion 32 based on the output signal S2 and the estimated static strain signal S3. Accordingly, when the movable portion 32 is resonated to drive the actuator device 1, since it is possible to accurately generate the resonant signal S4 corresponding to an oscillation angle and a phase of the movable portion 32 by subtracting the estimated static strain signal S3 from the output signal S2, it is possible to accurately detect the oscillation angle and the phase of the movable portion 32.

MODIFICATION EXAMPLES

The present disclosure is not limited to the above-described embodiment. For example, the first electrode unit 13 may be an electrode unit provided to the metal substrate 3. For example, the piezoelectric drive element 6 may not include the electrode 63, and the first electrode unit 13 may include the bonding member 8A and the conductive portion 30 or may include only the conductive portion 30. In addition, the second electrode unit 14 may be an electrode unit provided to the piezoelectric drive body 61. For example, the piezoelectric detection element 7 may not include the electrode 73, and the second electrode unit 14 may include the bonding member 8B and the electrode 62 of the piezoelectric drive element 6 or, for example, the piezoelectric drive element 6 may not include the electrode 62, and the second electrode unit 14 may include the bonding member 8B and the electrode 73 of the piezoelectric detection element 7. In addition, for example, the second electrode unit 14 may include only the electrode 62 or may include only the electrode 73.

The wiring substrate 2 is not limited to the shape of the above embodiment and may include, for example, a recessed portion in which a central portion is recessed opposite the metal substrate 3 with respect to the placement surface 2*a*, instead of an opening. In addition, for example, the wiring substrate 2 may include a plurality of column portions instead of an opening. In addition, in the above embodiment, the wiring substrate 2 that supports the metal substrate 3 has been provided as an example, but the metal substrate 3 may be supported by, for example, a support body including a single or a plurality of members. In addition, the positions at which the electrode pad 21, the electrode pad 22, and the electrode pad 23 are provided to the support body are also not limited to the example of the above embodiment. For example, the electrode pad 21 may be located at a region in a surface of the support body, the region facing the metal substrate 3. In addition, for example, the electrode pad 22 may be located at a region in the surface of the support body, the region being where the electrode 62 is disposed with respect to the metal substrate 3 in the Z-axis direction, and the electrode pad 23 may be located at a region in the surface of the support body, the region being where the electrode 72 is disposed with respect to the metal substrate 3 in the Z-axis direction.

The piezoelectric drive element 6 and the piezoelectric detection element 7 may have an opposite positional relationship and configuration. In the examples illustrated in FIGS. 6 and 7, the piezoelectric detection element 7 is fixed to the surface 30*a* of the conductive portion 30, and the piezoelectric drive element 6 is fixed onto the piezoelectric detection element 7. The piezoelectric detection element 7 includes the piezoelectric detection body (a first piezoelectric body or a piezoelectric body on the other electrode unit side) 71, the electrode (second electrode) 72, and the electrode (first electrode) 73. The piezoelectric detection body 71 includes the third main surface (first main surface) 71*a*, the fourth main surface (second main surface) 71*b*, and the side surface 71*c*. The piezoelectric drive element 6 includes the piezoelectric drive body (a second piezoelectric body or a piezoelectric body on one electrode unit side) 61, the electrode (fourth electrode) 62, and the electrode (third electrode) 63. The piezoelectric drive body 61 includes the first main surface (third main surface) 61*a*, the second main surface (fourth main surface) 61*b*, and the side surface 61*c*.

The piezoelectric detection element 7 is disposed on the surface 30*a* of the conductive portion 30 such that a part of the main surface 31*a* of the metal substrate 3 is located outside the side surface 71*c* of the piezoelectric detection body 71. Accordingly, the corner C1 is formed by the part of the main surface 31*a* and the side surface 71*c* of the piezoelectric detection body 71. The part of the main surface 31*a* is a portion of the main surface 31*a* outside the side surface 71*c*. The first portion 81 of the bonding member 8A is disposed between the surface 30*a* of the conductive portion 30 and the piezoelectric detection element 7, and the second portion 82 is continuous from the first portion 81 and is disposed in the corner C1. The second portion 82 is in contact with the side surface 71*c* of the piezoelectric detection body 71 and with the part of the main surface 31*a*. At least a part of the second portion 82 reaches a region on the electrode 72 side of the side surface 71*c* of the piezoelectric detection body 71. In addition, the second portion 82 does not reach the outer edge 711 of the third main surface 71a.

The piezoelectric drive element 6 is disposed on the surface 72a such that a part of the surface 72a of the electrode 72 is located outside the side surface 61c of the piezoelectric drive body 61. The surface 72a is a main surface on an opposite side of the electrode 72 from the piezoelectric detection body 71. Accordingly, the corner C2 is formed by the part of the surface 72a of the electrode 72 and the side surface 61c of the piezoelectric drive body 61. The part of the surface 72a is a portion of the surface 72a outside the side surface 61c. The third portion 83 of the bonding member 8B is a portion disposed between the surface 72a of the electrode 72 and the piezoelectric drive element 6, and the fourth portion 84 is continuous from the third portion 83 and is disposed in the corner C2. The fourth portion 84 is in contact with the side surface 61c of the piezoelectric drive body 61 and with the part of the surface 72a of the electrode 72. At least a part of the fourth portion 84 reaches a region on the electrode 62 side of the side surface 61c of the piezoelectric drive body 61. In addition, the fourth portion 84 does not reach the outer edge 611 of the first main surface 61a.

The width of the piezoelectric drive body 61 in the X-axis direction is smaller than the width of the piezoelectric detection body 71 in the X-axis direction, and the width of the piezoelectric drive body 61 in the Y-axis direction is smaller than the width of the piezoelectric detection body 71 in the Y-axis direction. In addition, when viewed in the Z-axis direction, the outer edge 61d of the piezoelectric drive body 61 is located inside the outer edge 71d of the piezoelectric detection body 71.

Figure 7:
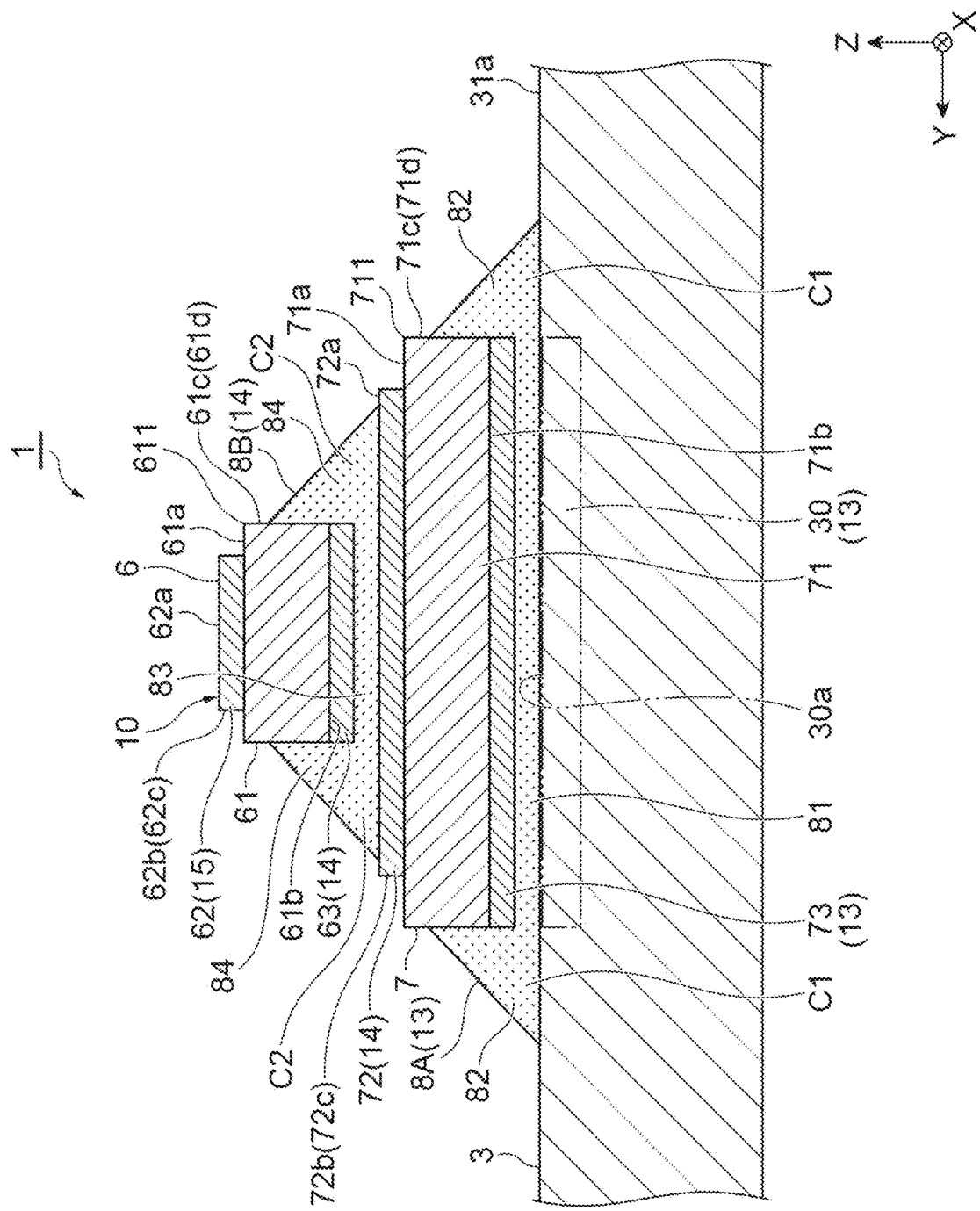
FIG. 7 is a cross-sectional view of a metal substrate, a piezoelectric detection element, and a piezoelectric drive element illustrated in FIG. 6.

As illustrated in FIG. 7, the first electrode unit 13 is provided to the metal substrate 3. The first electrode unit 13 includes the conductive portion 30, the bonding member 8A, and the electrode 73 of the piezoelectric detection element 7. In the present modification example, the first electrode unit 13 includes the conductive portion 30, at least a part of the bonding member 8A, and the electrode 73 of the piezoelectric detection element 7. In the first electrode unit 13, the electrode 73 and the conductive portion 30 are bonded by the bonding member 8A. The piezoelectric detection body 71 is disposed on the first electrode unit 13. The second electrode unit 14 is disposed on the third main surface 71a of the piezoelectric detection body 71. The third main surface 71a is a main surface opposite the first electrode unit 13, and the fourth main surface 71b is a main surface on the first electrode unit 13 side. The second electrode unit 14 includes the electrode 72 of the piezoelectric detection element 7, the bonding member 8B, and the electrode 63 of the piezoelectric drive element 6. In the present modification example, the second electrode unit 14 includes the electrode 72, at least a part of the bonding member 8B, and the electrode 63. In the second electrode unit 14, the electrode 72 and the electrode 63 are bonded by the bonding member 8B. The piezoelectric drive body 61 is disposed on the second electrode unit 14. The third electrode unit 15 is disposed on the first main surface 61a of the piezoelectric drive body 61. The first main surface 61a is a main surface opposite the second electrode unit 14, and the second main surface 61b is a main surface on the second electrode unit 14 side. The third electrode unit 15 includes the electrode 62 of the piezoelectric drive element 6. In the present modification example, the third electrode unit 15 is formed of the electrode 62. As described above, the piezoelectric detection body 71 is disposed between the first electrode unit 13 and the second electrode unit 14, and the piezoelectric drive body 61 is disposed between the second electrode unit 14 and the third electrode unit 15.

Figure 6:
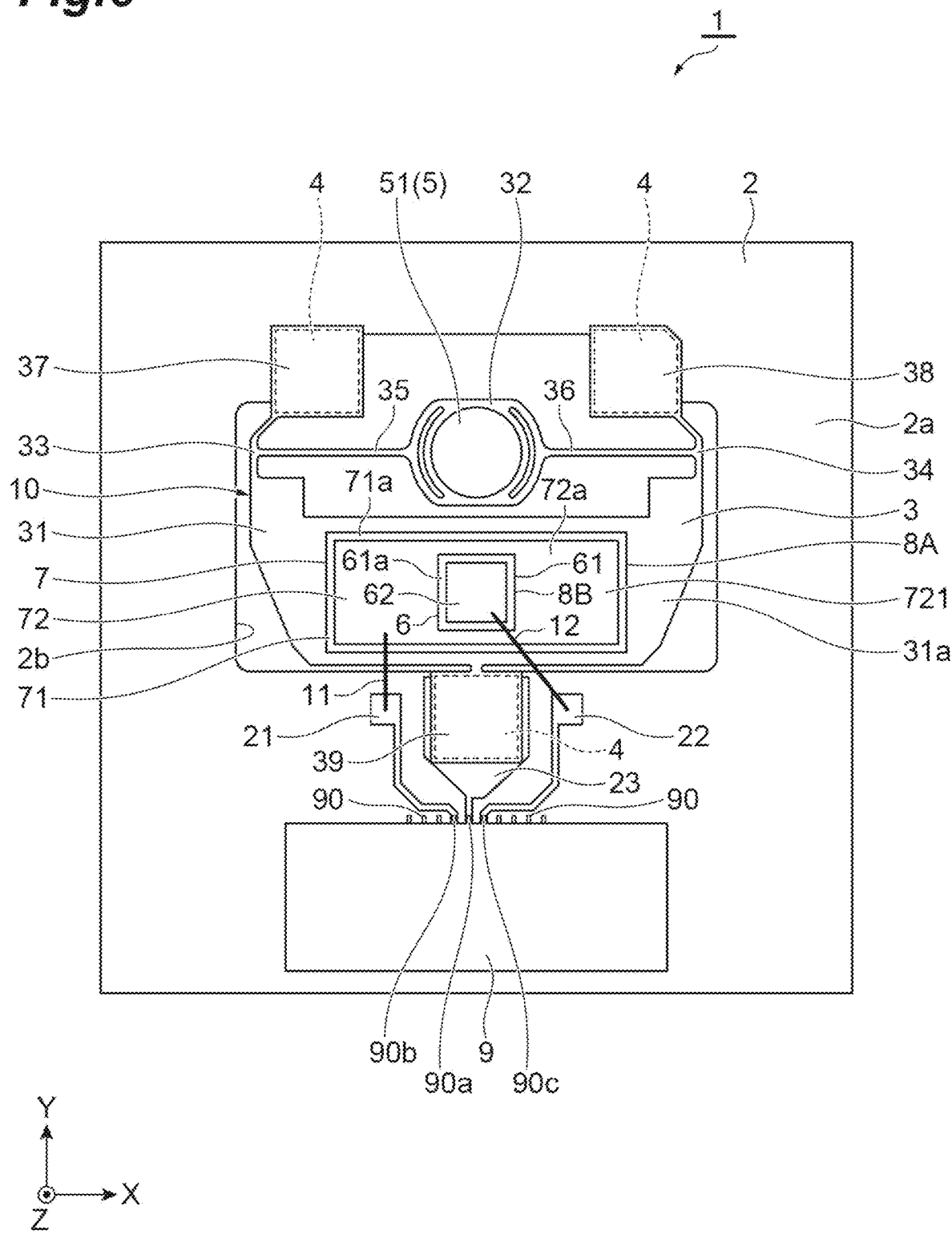
FIG. 6 is a plan view of an actuator device of a modification example.

The first electrode unit 13 is electrically connected to the output unit 93 of the connector 9 via the metal substrate 3, the bonding member 4, the electrode pad 23, a wiring of the wiring substrate 2, and the terminal 90a. The second electrode unit 14 is electrically connected to the connection unit 92 of the connector 9 via the wire 11 bridged between a region 721 on the surface 72a of the electrode 72 and the electrode pad 21, the electrode pad 21, the wiring of the wiring substrate 2, and the terminal 90b. As illustrated in FIG. 6, the region 721 is a region that is located on the surface 72a of the electrode 72 outside the piezoelectric drive body 61 when viewed in the Z-axis direction. The third electrode unit 15 is electrically connected to the input unit 91 of the connector 9 via the wire 12, the electrode pad 22, a wiring of the wiring substrate 2, and the terminal 90c. Also, in the present modification example, since the piezoelectric drive body 61 and the piezoelectric detection body 71 are stacked on top of each other on the same side with respect to the metal substrate 3, a variation in the relative positional relationship between the piezoelectric drive body 61 and the piezoelectric detection body 71 is unlikely to occur, so that it is possible to obtain the same effects as those of the above embodiment. In addition, in the present modification example, the second electrode unit 14 includes the electrode 63 disposed on the second main surface 61b. Accordingly, it is possible to uniformly apply a drive voltage to the second main surface 61b of the piezoelectric drive body 61, and it is possible to improve the driving efficiency.

In the above embodiment, the optical function unit 5 has the optical surface 51 that is a mirror surface, but the optical function unit 5 may be, for example, a reflection type diffraction grating, a transmission type diffraction grating, an optical filter, or the like. In addition, the actuator device 1 may include, the wiring substrate 2, the metal substrate 3, the first electrode unit 13, the piezoelectric drive body 61, the second electrode unit 14, the piezoelectric detection body 71, the third electrode unit 15, the input unit 91, the connection unit 92, and the output unit 93. For example, the actuator device 1 may not include the connector 9, the wire 11, the wire 12, the bonding member 8A, and the bonding member 8B. When the actuator device 1 does not include the connector 9, for example, each of the input unit 91, the connection unit 92, and the output unit 93 may be directly provided to the wiring substrate 2, and connected to the control unit 20 via wires and the like. In addition, in the above embodiment, the first coupling portion 35 couples the movable portion 32 and the main body portion 31 via the first extending portion 33, but the first coupling portion 35 may directly couple the movable portion 32 and the main body portion 31. Similarly, in the above embodiment, the second coupling portion 36 couples the movable portion 32 and the main body portion 31 via the second extending portion 34, but the second coupling portion 36 may directly couple the movable portion 32 and the main body portion 31. In addition, the metal substrate 3 may include the movable portion 32, the main body portion 31 provided with the first electrode unit 13, and a coupling portion that couples the movable portion 32 and the main body portion 31. For example, the metal substrate 3 may not include the first connection portion 37, the second connection portion 38, and the third connection portion 39, a portion of the main body portion 31 of the metal substrate 3 may face a portion of the wiring substrate 2, and the portion of the main body portion 31 and the portion of the wiring substrate 2 may be bonded by the bonding member 4.

In addition, the piezoelectric drive body 61 and the piezoelectric detection body 71 may not be disposed such that the center point of the piezoelectric drive body 61 and the center point of the piezoelectric detection body 71 coincide with each other when viewed in the Z-axis direction. In addition, the piezoelectric drive body 61 may not be disposed to be axisymmetric with respect to both the straight line passing through the center point of the piezoelectric drive body 61 along the X-axis direction and the straight line passing through the center point of the piezoelectric drive body 61 in the Y-axis direction. In addition, the piezoelectric detection body 71 may also not be disposed to be axisymmetric with respect to both the straight line passing through the center point of the piezoelectric detection body 71 along the X-axis direction and the straight line passing through the center point of the piezoelectric detection body 71 in the Y-axis direction. In addition, the shape of each of the piezoelectric drive body 61 and the piezoelectric detection body 71 is not limited, and may be, for example, a shape that is not line symmetric. In that case, for example, the control unit 20 may perform the correction process of causing the phase of the output signal S2 and the phase of the estimated static strain signal S3 to coincide with each other before the process of subtracting the estimated static strain signal S3 from the output signal S2. In addition, the drive signal to be input to the piezoelectric drive body 61 may not be a signal to cause a resonant operation of the movable portion.

The configuration of the drive signal generation unit 20A and the output signal processing unit 20B of the control unit 20 is not limited to the above embodiment. The drive signal generation unit 20A may generate the drive signal S1 and, for example, include only the generation unit 202 or, for example, may include other components included in the control unit 20. The output signal processing unit 20B may generate the estimated static strain signal S3 based on information related to the frequency and the amplitude of the drive signal S1, and generate the resonant signal S4 based on the output signal S2 and the estimated static strain signal S3. For example, the output signal processing unit 20B may include only the differential amplifier 205 or, for example, may include other components included in the control unit 20.

The piezoelectric drive body 61 may be a piezoelectric body that operates the movable portion 32, and the piezoelectric detection body 71 may be a piezoelectric body configured to detect an operation amount. For example, the actuator device 1 may be subjected to a second resonant mode in addition to a mode in which torsional vibration (torsional resonance) is induced in the first coupling portion 35 and in the second coupling portion 36 and the movable portion 32 and the optical surface 51 oscillate around an X axis (hereinafter, referred to as a "first resonant mode") or instead of the first resonant mode. The second resonant mode is a mode in which because of the generation of periodic plate waves, the first coupling portion 35 and the second coupling portion 36 move along the Z-axis direction (move in a translational manner), thereby moving the movable portion 32 and the optical surface 51 along the Z-axis direction. In the second resonant mode, a displacement amount and a phase of the optical surface 51 may be detected, and the output signal S2 may be a voltage signal corresponding to a change in the displacement amount and the phase caused by the movement of the movable portion 32 and the optical surface 51. In addition, in the second resonant mode, the resonant signal S4 may be a voltage signal corresponding to the displacement amount and the phase of the movable portion 32. Accordingly, also, in the second resonant mode, since it is possible to accurately generate the resonant signal corresponding to the displacement amount and the phase of the movable portion 32, it is possible to accurately detect the displacement amount and the phase of the movable portion 32.

An actuator device according to one aspect of the present disclosure includes: a support body; a metal substrate supported by the support body; a first electrode unit provided to the metal substrate; a first piezoelectric body disposed on the first electrode unit, and having a first main surface opposite the first electrode unit, and a second main surface on a first electrode unit side; a second electrode unit disposed on the first main surface; a second piezoelectric body disposed on the second electrode unit, and having a third main surface opposite the second electrode unit, and a fourth main surface on a second electrode unit side; a third electrode unit disposed on the third main surface; a connection unit electrically connected to the second electrode unit; an input unit electrically connected to one electrode unit of the first electrode unit and the third electrode unit; and an output unit electrically connected to the other electrode unit of the first electrode unit and the third electrode unit. The metal substrate includes a movable portion, a main body portion provided with the first electrode unit, and a coupling portion coupling the movable portion and the main body portion. A piezoelectric body on one electrode unit side of the first piezoelectric body and the second piezoelectric body is a piezoelectric drive body configured to drive the movable portion. A piezoelectric body on the other electrode unit side of the first piezoelectric body and the second piezoelectric body is a piezoelectric detection body configured to detect an operation amount of the movable portion. The connection unit is configured to be electrically connected to a reference potential on an outside such that a potential of the second electrode unit becomes the reference potential. The input unit is configured to input a drive signal to the one electrode unit from the outside, the drive signal being a signal to drive the piezoelectric drive body. The output unit is configured to output an output signal to the outside from the other electrode unit, the output signal generated in the piezoelectric detection body.

In the actuator device, the first piezoelectric body, the second electrode unit, the second piezoelectric body, and the third electrode unit are stacked on top of each other in order on the first electrode unit provided to the metal substrate. One of the first piezoelectric body and the second piezoelectric body functions the piezoelectric drive body configured to drive the movable portion. The other of the first piezoelectric body and the second piezoelectric body functions the piezoelectric detection body configured to detect the operation amount of the movable portion. Since the piezoelectric drive body and the piezoelectric detection body are stacked on top of each other on the same side with respect to the metal substrate in such a manner, a variation in a relative positional relationship between the piezoelectric drive body and the piezoelectric detection body is unlikely to occur. Therefore, according to the actuator device, it is possible to accurately detect an operation amount of the movable portion.

The actuator device according to the present disclosure may further include a connector disposed on the support body and housing the connection unit, the input unit, and the output unit. Accordingly, it is possible to simply and reliably perform electrical connection between each of the electrode units and the outside.

In the actuator device according to the present disclosure, when viewed in a thickness direction of the metal substrate, an outer edge of the second piezoelectric body may be located inside an outer edge of the first piezoelectric body. Accordingly, since it is possible to dispose the second piezoelectric body while seeing the first piezoelectric body during manufacturing, it is possible to perform positioning between the first piezoelectric body and the second piezoelectric body with higher accuracy.

In the actuator device according to the present disclosure, the first electrode unit may include a first electrode disposed on the second main surface. Accordingly, for example, when the first piezoelectric body is the piezoelectric drive body, it is possible to uniformly apply a drive voltage to the second main surface of the first piezoelectric body, and it is possible to improve the driving efficiency.

The actuator device according to the present disclosure may further include a first bonding member having conductivity. The first electrode unit may further include a conductive portion integrally formed with the metal substrate, and a second bonding member having conductivity. The support body may include a first electrode pad electrically connected to the input unit or to the output unit. The first electrode pad may be located at a region in a surface of the support body, the region facing the metal substrate. The first bonding member may bond the metal substrate and the first electrode pad. The second bonding member may bond the first electrode and the conductive portion. Accordingly, it is possible to electrically connect the first electrode unit and the input unit or the first electrode unit and the output unit with simplicity and reliability.

In the actuator device according to the present disclosure, the second electrode unit may include a second electrode disposed on the first main surface. Accordingly, for example, when the second piezoelectric body is the piezoelectric drive body, it is possible to uniformly apply a drive voltage to the fourth main surface of the second piezoelectric body, and it is possible to improve the driving efficiency.

The actuator device according to the present disclosure may further include a first wire. The support body may include a second electrode pad electrically connected to the connection unit. The second electrode pad may be located at a region in a surface of the support body, the region being where the second electrode is disposed with respect to the metal substrate in a thickness direction of the metal substrate. The first wire may be bridged between the second electrode and the second electrode pad. Accordingly, it is possible to electrically connect the second electrode unit and the connection unit with simplicity and reliability.

In the actuator device according to the present disclosure, the second electrode may include a region located outside the second piezoelectric body when viewed in the thickness direction of the metal substrate, and the first wire may be bridged between the region and the second electrode pad. Accordingly, with a simple configuration, it is possible to electrically connect the second electrode unit disposed between the first piezoelectric body and the second piezoelectric body, to the connection unit.

In the actuator device according to the present disclosure, the second electrode unit may further include a third electrode disposed on the fourth main surface. Accordingly, for example, when the second piezoelectric body is the piezoelectric drive body, it is possible to uniformly apply a drive voltage to the fourth main surface of the second piezoelectric body, and it is possible to improve the driving efficiency.

In the actuator device according to the present disclosure, the second electrode unit may further include a third bonding member having conductivity, and the third bonding member may bond the second electrode and the third electrode. Accordingly, with a simple configuration, it is possible to realize the input of a desired drive signal to the piezoelectric drive body and the highly accurate detection of the output signal generated in the piezoelectric detection body.

The actuator device according to the present disclosure may further include a second wire. The third electrode unit may include a fourth electrode disposed on the third main surface. The support body may include a third electrode pad electrically connected to the input unit or to the output unit. The third electrode pad may be located at a region in a surface of the support body, the region being where the fourth electrode is disposed with respect to the metal substrate in a thickness direction of the metal substrate. The second wire may be bridged between the fourth electrode and the third electrode pad. Accordingly, it is possible to electrically connect the third electrode unit and the input unit or the third electrode unit and the output unit with simplicity and reliability.

In the actuator device according to the present disclosure, the first piezoelectric body may be the piezoelectric drive body, the second piezoelectric body may be the piezoelectric detection body, the first electrode unit may be electrically connected to the input unit, and the third electrode unit may be electrically connected to the output unit. Accordingly, since it is easy for vibration of the piezoelectric drive body to appropriately propagate to the metal substrate, it is possible to obtain a desired driving characteristic.

An actuator system according to the present disclosure includes: the actuator device; and a control unit electrically connected to the input unit of the actuator device and the output unit of the actuator device. The control unit includes a drive signal generation unit that generates the drive signal, and an output signal processing unit that processes the output signal.

Since the actuator system includes the actuator device, for the same reason as in the actuator device, it is possible to accurately detect an operation amount of the movable portion.

In the actuator system according to the present disclosure, the drive signal generation unit may generate the drive signal to cause a resonant operation of the movable portion. The output signal processing unit may generate an estimated static strain signal estimated to be included in the output signal, based on information related to a frequency of the drive signal and an amplitude of the drive signal, and generate a resonant signal of the movable portion based on the output signal and the estimated static strain signal. Accordingly, when the movable portion is resonated to drive the actuator device, since it is possible to accurately generate the resonant signal corresponding to an operation amount of the movable portion by subtracting the estimated static strain signal from the output signal, it is possible to accurately detect the operation amount of the movable portion.

According to one aspect of the present disclosure, it is possible to provide the actuator device and the actuator system capable of accurately detecting an operation amount of the movable portion.

What is claimed is:

1. An actuator device comprising:
   a support body;
   a metal substrate supported by the support body;
   a first electrode unit provided to the metal substrate;
   a first piezoelectric body disposed on the first electrode unit, and having a first main surface opposite the first electrode unit, and a second main surface on the first electrode unit side;

a second electrode unit disposed on the first main surface;
a second piezoelectric body disposed on the second electrode unit, and having a third main surface opposite the second electrode unit, and a fourth main surface on the second electrode unit side;
a third electrode unit disposed on the third main surface;
a connection unit electrically connected to the second electrode unit;
an input unit electrically connected to one electrode unit of the first electrode unit and the third electrode unit; and
an output unit electrically connected to the other electrode unit of the first electrode unit and the third electrode unit,
wherein the metal substrate includes a movable portion, a main body portion provided with the first electrode unit, and a coupling portion coupling the movable portion and the main body portion,
one of the first piezoelectric body and the second piezoelectric body is on one electrode unit side with respect to the other of the first piezoelectric body and the second piezoelectric body, and is a piezoelectric drive body configured to drive the movable portion,
the other of the first piezoelectric body and the second piezoelectric body is on the other electrode unit side with respect to one of the first piezoelectric body and the second piezoelectric body, and is a piezoelectric detection body configured to detect an operation amount of the movable portion,
the connection unit is configured to be electrically connected to a reference potential on an outside such that a potential of the second electrode unit becomes the reference potential,
the input unit is configured to input a drive signal to the one electrode unit from the outside, the drive signal being a signal to drive the piezoelectric drive body, and
the output unit is configured to output an output signal to the outside from the other electrode unit, the output signal generated in the piezoelectric detection body.

2. The actuator device according to claim 1, further comprising:
a connector disposed on the support body and housing the connection unit, the input unit, and the output unit.

3. The actuator device according to claim 1,
wherein when viewed in a thickness direction of the metal substrate, an outer edge of the second piezoelectric body is located inside an outer edge of the first piezoelectric body.

4. The actuator device according to claim 1,
wherein the first electrode unit includes a first electrode disposed on the second main surface.

5. The actuator device according to claim 4, further comprising:
a first bonding member having conductivity,
wherein the first electrode unit further includes a conductive portion integrally formed with the metal substrate, and a second bonding member having conductivity,
the support body includes a first electrode pad electrically connected to the input unit or to the output unit,
the first electrode pad is located at a region in a surface of the support body, the region facing the metal substrate,
the first bonding member bonds the metal substrate and the first electrode pad, and
the second bonding member bonds the first electrode and the conductive portion.

6. The actuator device according to claim 1,
wherein the second electrode unit includes a second electrode disposed on the first main surface.

7. The actuator device according to claim 6, further comprising:
a first wire,
wherein the support body includes a second electrode pad electrically connected to the connection unit,
the second electrode pad is located at a region in a surface of the support body, the region being where the second electrode is disposed with respect to the metal substrate in a thickness direction of the metal substrate, and
the first wire is bridged between the second electrode and the second electrode pad.

8. The actuator device according to claim 7,
wherein the second electrode includes a region located outside the second piezoelectric body when viewed in the thickness direction of the metal substrate, and
the first wire is bridged between the region and the second electrode pad.

9. The actuator device according to claim 6,
wherein the second electrode unit further includes a third electrode disposed on the fourth main surface.

10. The actuator device according to claim 9,
wherein the second electrode unit further includes a third bonding member having conductivity, and
the third bonding member bonds the second electrode and the third electrode.

11. The actuator device according to claim 1, further comprising:
a second wire,
wherein the third electrode unit includes a fourth electrode disposed on the third main surface,
the support body includes a third electrode pad electrically connected to the input unit or to the output unit,
the third electrode pad is located at a region in a surface of the support body, the region being where the fourth electrode is disposed with respect to the metal substrate in a thickness direction of the metal substrate, and
the second wire is bridged between the fourth electrode and the third electrode pad.

12. The actuator device according to claim 1,
wherein the first piezoelectric body is the piezoelectric drive body,
the second piezoelectric body is the piezoelectric detection body,
the first electrode unit is electrically connected to the input unit, and
the third electrode unit is electrically connected to the output unit.

13. An actuator system comprising:
the actuator device according to claim 1; and
a control unit electrically connected to the input unit of the actuator device and the output unit of the actuator device,
wherein the control unit includes a drive signal generation unit that generates the drive signal, and an output signal processing unit that processes the output signal.

14. The actuator system according to claim 13,
wherein the drive signal generation unit generates the drive signal to cause a resonant operation of the movable portion, and
the output signal processing unit generates an estimated static strain signal estimated to be included in the output signal, based on information related to a frequency of the drive signal and an amplitude of the drive signal, and generates a resonant signal of the movable portion based on the output signal and the estimated static strain signal.

* * * * *